United States Patent
Aritome

(10) Patent No.: US 9,196,317 B2
(45) Date of Patent: Nov. 24, 2015

(54) SEMICONDUCTOR DEVICE

(71) Applicant: SK hynix Inc., Icheon-si Gyeonggi-do (KR)

(72) Inventor: Seiichi Aritome, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 144 days.

(21) Appl. No.: 13/846,381

(22) Filed: Mar. 18, 2013

(65) Prior Publication Data
US 2014/0192584 A1     Jul. 10, 2014

(30) Foreign Application Priority Data
Jan. 7, 2013 (KR) .................... 10-2013-0001655

(51) Int. Cl.
| | |
|---|---|
| G11C 5/06 | (2006.01) |
| G11C 5/02 | (2006.01) |
| G11C 16/04 | (2006.01) |
| H01L 27/06 | (2006.01) |
| H01L 27/115 | (2006.01) |

(52) U.S. Cl.
CPC ............. *G11C 5/063* (2013.01); *G11C 5/025* (2013.01); *G11C 16/0483* (2013.01); *H01L 27/0688* (2013.01); *H01L 27/11582* (2013.01)

(58) Field of Classification Search
CPC ....... G11C 16/0483; G11C 5/06; G11C 5/025
USPC ................. 365/185.05, 185.17, 185.11
See application file for complete search history.

(56) References Cited

U.S. PATENT DOCUMENTS

| | | | |
|---|---|---|---|
| 2009/0185422 A1* | 7/2009 | Kang et al. ............. | 365/185.11 |
| 2009/0323426 A1* | 12/2009 | Tanaka et al. ........... | 365/185.18 |
| 2010/0020617 A1* | 1/2010 | Oh et al. ................. | 365/185.23 |
| 2010/0054036 A1* | 3/2010 | Lee et al. ................ | 365/185.03 |
| 2010/0172182 A1* | 7/2010 | Seol et al. ............... | 365/185.17 |
| 2011/0013458 A1* | 1/2011 | Seol ........................ | 365/185.18 |
| 2011/0194357 A1* | 8/2011 | Han et al. ................ | 365/185.29 |

(Continued)

FOREIGN PATENT DOCUMENTS

| | | |
|---|---|---|
| KR | 10-0895853 B1 | 4/2009 |
| KR | 1020100052597 A | 5/2010 |

(Continued)

OTHER PUBLICATIONS

Yoshiaki Fukuzumi et al, Optimal Integration and Characteristics of Vertical Array Devices for Ultra-High Density, Bit-Cost Scalable Flash Memory, IEEE Electron Devices Meeting, Dec. 2007, pp. 449-452.

(Continued)

*Primary Examiner* — Douglas King
(74) *Attorney, Agent, or Firm* — William Park & Associates Ltd.

(57) ABSTRACT

A semiconductor device includes a first memory block including first vertical strings, a second memory block including second vertical strings coupled in series with the first vertical strings, wherein the second memory block is stacked on the first memory block, first bit lines located between the first memory block and the second memory block and electrically coupled to the first and second vertical strings, first source lines located under the first memory block and electrically coupled to the first vertical strings, and second source lines located above the second memory block and electrically coupled to the second vertical strings.

20 Claims, 17 Drawing Sheets

(56) References Cited

U.S. PATENT DOCUMENTS

2011/0310673 A1* 12/2011 Cho et al. ............... 365/185.22
2012/0211823 A1* 8/2012 Lim et al. ...................... 257/326

FOREIGN PATENT DOCUMENTS

| KR | 1020120003351 A | 1/2012 |
|---|---|---|
| KR | 10-2014-0088385 A | 7/2014 |

OTHER PUBLICATIONS

H. Tanaka et al., Bit Cost Scalable Technology with Punch and Plug Process for Ultra High Density Flash Memory, Symposium on VLSI Technology Digest of Technical Papers, 2007, pp. 14-15.

Seiichi Artome, "Scaling Challenges Beyond 1xnm DRAM and NAND Flash", Jun. 12, 2012., Joint Rump @ VLSA Symposium. 2012, Honolulu, HI, U.S.A.

* cited by examiner

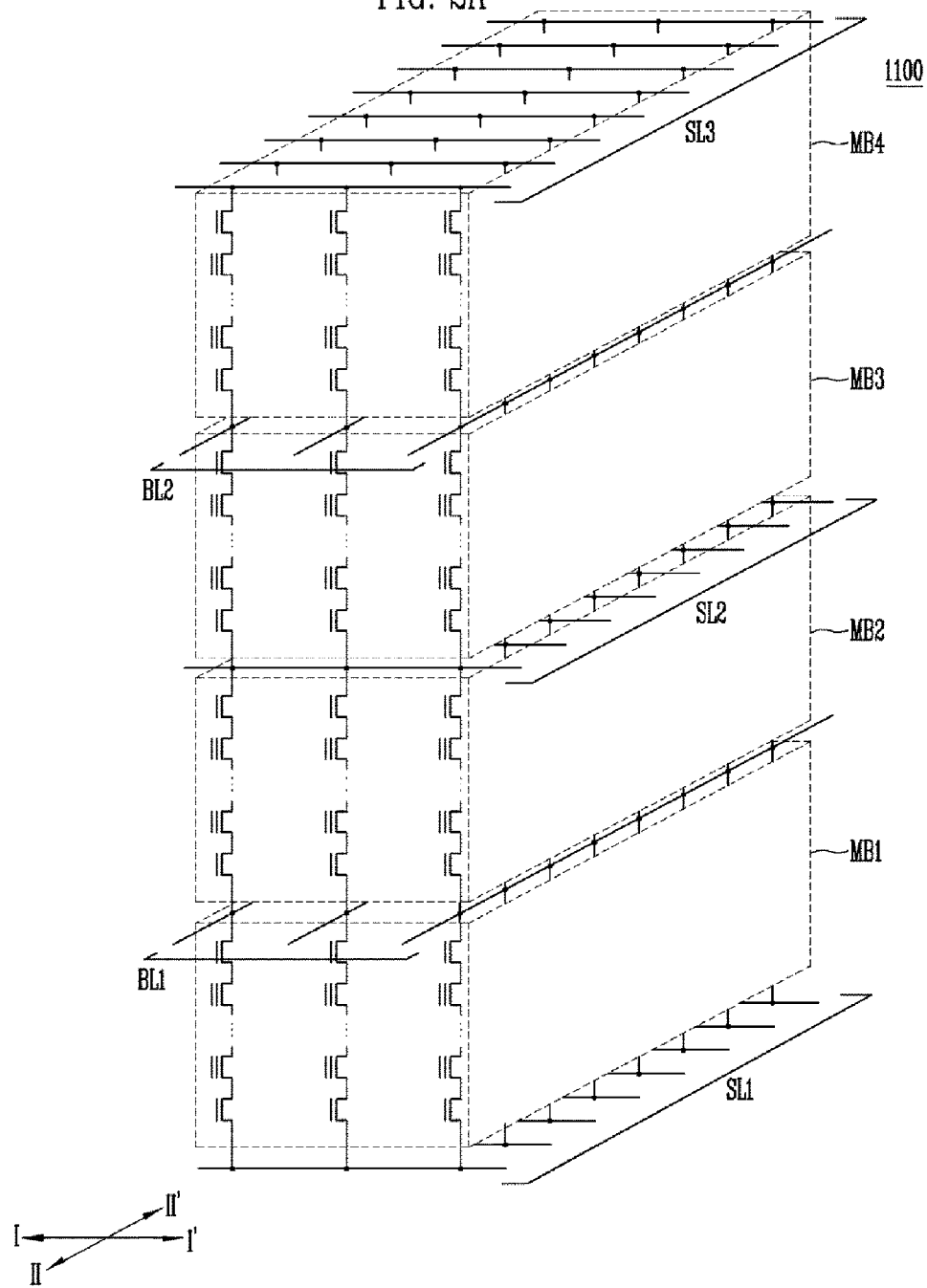

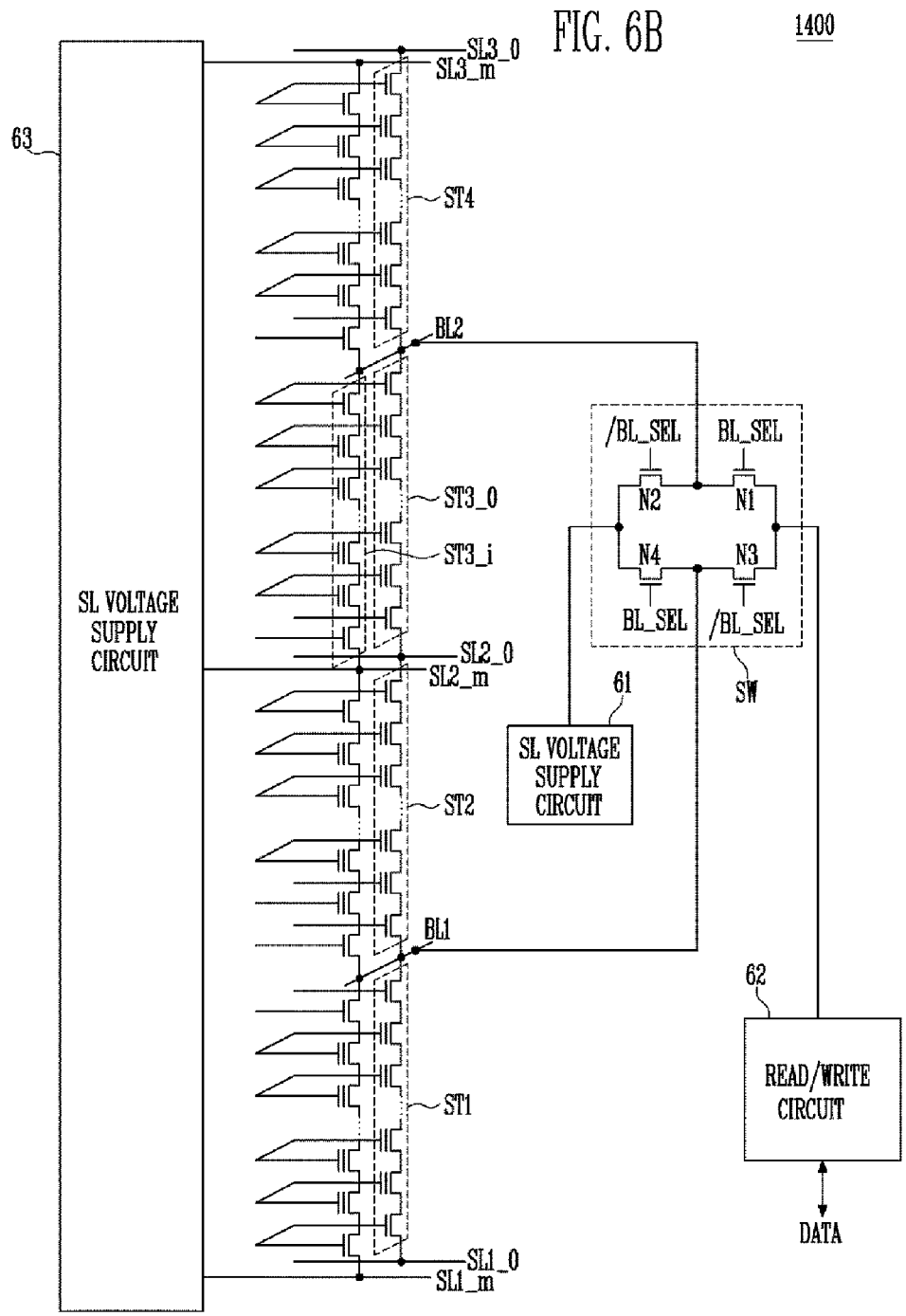

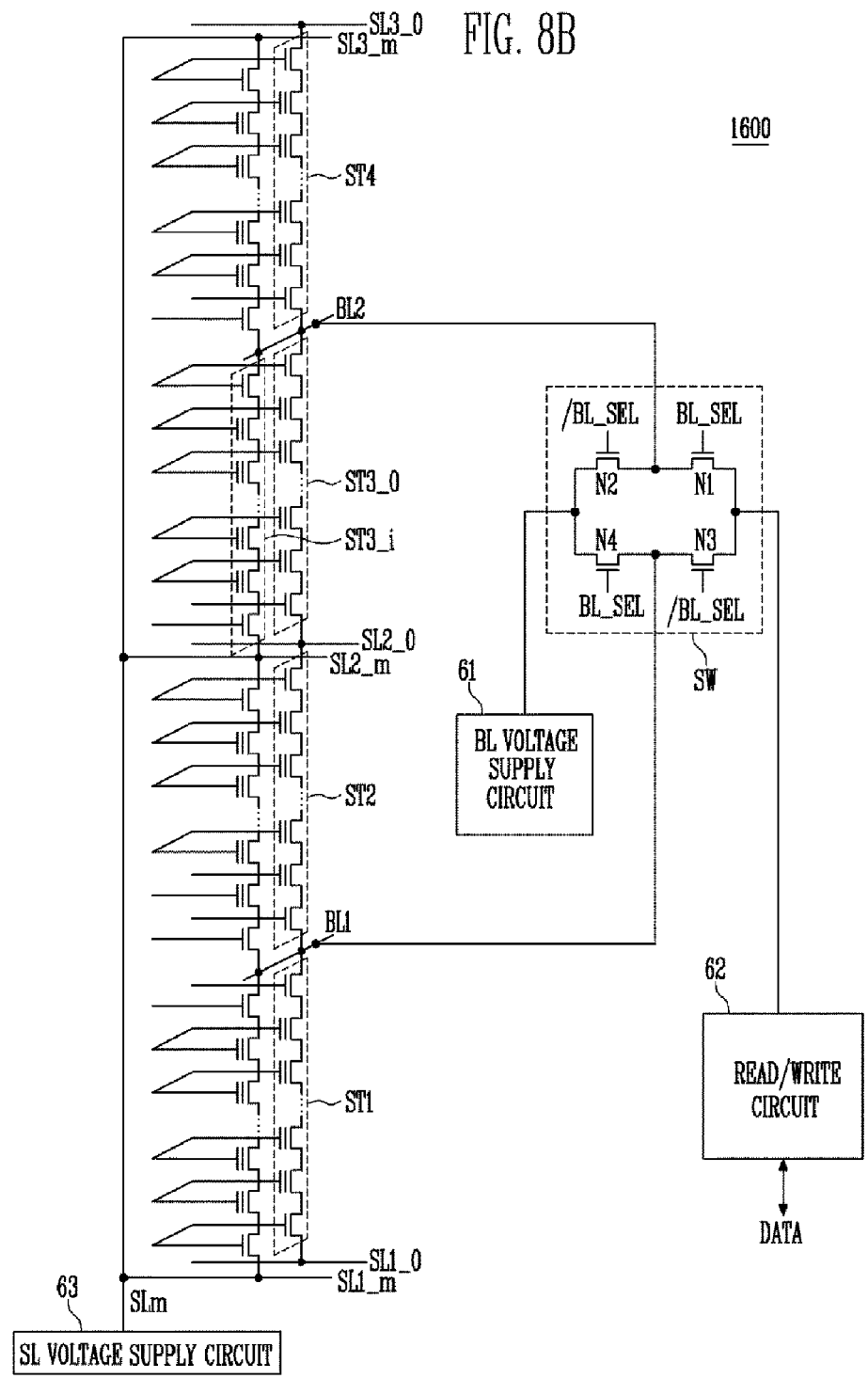

SEMICONDUCTOR DEVICE

CROSS-REFERENCE TO RELATED APPLICATION

This application claims priority from Korean Patent Application No. 10-2013-0001655, filed on Jan. 7, 2013, the contents of which are incorporated herein by reference in its entirety.

BACKGROUND

1. Technical Field

Various embodiments relate generally to a semiconductor device and, more particularly, to a three-dimensional semiconductor device.

2. Related Art

A non-volatile memory device retains data stored therein even when not powered. Two-dimensional memory devices in which channels of memory cells are fabricated in a single layer over a silicon substrate have reached physical limits in increasing their degree of integration. Accordingly, three-dimensional (3D) non-volatile memory devices in which memory cells (or channels of the memory cells) are stacked in a vertical direction over a silicon substrate have been proposed.

A 3D non-volatile memory device includes memory blocks including a plurality of strings that are arranged in a vertical direction over a substrate, and a page buffer and a word line driver that are configured to drive the memory blocks. However, since circuitry, such as the page buffer and the word line driver, occupies large space in a semiconductor device, the 3D non-volatile memory device may be limited in increasing its integration density. In addition, in terms of the structure of the 3D non-volatile memory device, performance may be deteriorated due to disturbance occurring between adjacent strings when the memory device is driven.

BRIEF SUMMARY

A semiconductor device according to an embodiment of the present invention may include a first memory block including first vertical strings, a second memory block including second vertical strings coupled in series with the first vertical strings, wherein the second memory block is stacked on top of the first memory block, first bit lines located between the first memory block and the second memory block and coupled to the first and second vertical strings, first source lines located under the first memory block and coupled to the first vertical strings, and second source lines located above the second memory block and coupled to the second vertical strings.

BRIEF DESCRIPTION OF THE DRAWINGS

FIGS. 2A and 2B are circuit diagrams of the structure of a semiconductor device according to a second embodiment of the present invention;

FIGS. 6A and 6B are circuit diagrams of a semiconductor device according to an embodiment of the present invention;

FIGS. 8A and 8B are circuit diagrams of a semiconductor device according to an embodiment of the present invention;

DETAILED DESCRIPTION

Figure 1A:
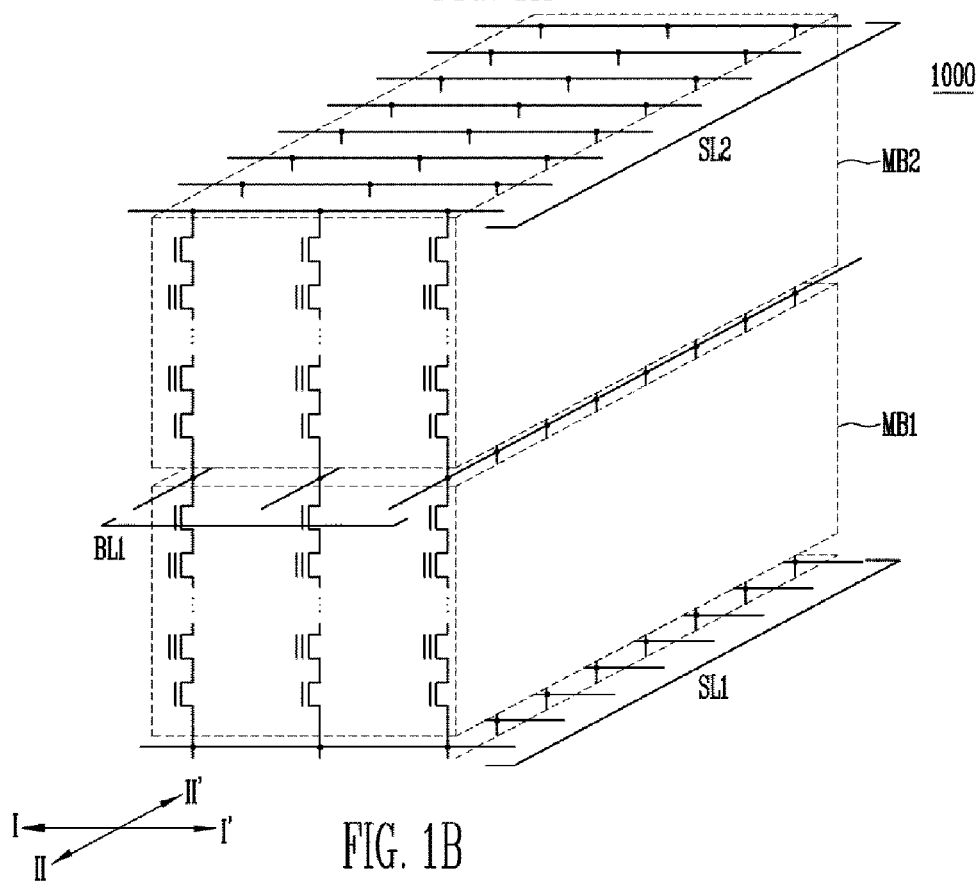
FIGS. 1A and 1B are circuit diagrams of the structure of a semiconductor device according to a first embodiment of the present invention.

Hereinafter, various embodiments of the present disclosure will be described in detail with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

Figure 1B:
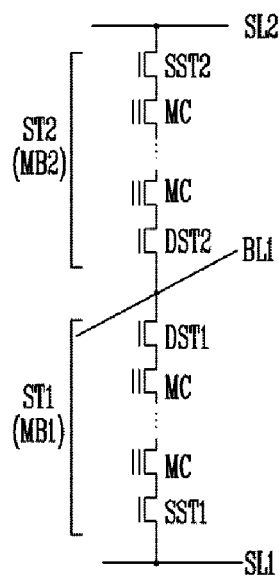

As illustrated in FIGS. 1A and 1B, the semiconductor device 1000 may include a first memory block MB1 and a second memory block MB2. The first memory block MB1 may include first vertical strings ST1. The second memory block MB2 may include second vertical strings ST2 and be stacked on top of the first memory block MB1.

The first and second vertical strings ST1 and ST2 may be arranged in a direction perpendicular to the surface of a substrate (not shown). Each of the first vertical strings ST1 may include at least one source selection transistor SST1, a plurality of memory cells MC and at least one drain selection transistor DST1 that are coupled in series. Each of the second vertical strings ST2 may include at least one source selection transistor SST2, a plurality of memory cells MC and at least one drain selection transistor DST2 that are coupled as the first vertical string ST1. In addition, the first vertical strings ST1 and the second vertical strings ST2 may be coupled in series with each other.

The semiconductor device 1000 may further include a plurality of first source lines SL1 coupled to the first vertical strings ST1, a plurality of second source lines SL2 coupled to the second vertical strings ST2 and first bit lines BL1 coupled to the first and second vertical strings ST1 and ST2.

The first bit lines BL1 may be located between the first memory block MB1 and the second memory block MB2, the first source lines SL1 may be located under the first memory block MB1, and the second source lines SL2 may be located above the second memory block MB2. In this example, the first and second memory blocks MB1 and MB2 may share the first bit lines BL1.

The second vertical strings ST2 of the second memory block MB2 may be arranged to be symmetrical to the first vertical strings ST1 of the first memory block MB1 based on the first bit lines BL1, so that the first the second memory blocks MB1 and MB2 share the first bit lines BL1.

The first source lines SL1 and the second source lines SL2 may extend in parallel along a first direction I-I' of the FIG.

1A, and the first bit lines BL1 may extend in parallel along a second direction II-II' of the FIG. 1A crossing the first direction I-I'.

Since the a plurality of memory blocks is formed to be stacked, a density of integration of the memory device may be improved.

Figure 2B:
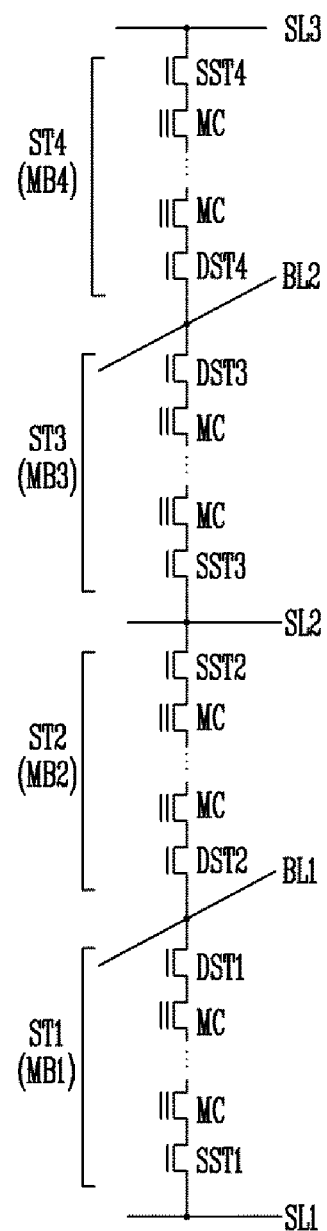

Referring to FIGS. 2A and 2B, the semiconductor device 1100 may further include a third memory block MB3 and a fourth memory blocks MB4 which that are sequentially stacked on the second memory block MB2 of the FIG. 1A.

The third memory block MB3 may include a plurality of third vertical strings ST3 and be stacked on top of the second memory block MB2. In addition, the fourth memory block MB4 may include a plurality of fourth vertical strings ST4 and be stacked on top of the third memory block MB3.

The first to fourth vertical strings ST1 to ST4 may be arranged in a direction perpendicular to the surface of the substrate (not shown). Each of the third vertical strings ST3 may include at least one source selection transistor SST3, a plurality of memory cells MC and at least one drain selection transistor DST3 that are coupled in series. Each of the fourth vertical strings ST4 may include at least one source selection transistor SST4, a plurality of memory cells MC and at least one drain selection transistor DST4 that are coupled in series. In addition, the first to fourth vertical strings ST1 to ST4 may be coupled in series.

The semiconductor device 1100 may further a plurality of third source lines SL3 and a plurality of second bit lines BL2 in addition to the plurality of first source lines SL1, the plurality of second source lines SL2 and the plurality of first bit lines BL1.

The plurality of first source lines SL1 may be electrically coupled to the first vertical strings ST1, as above described. The plurality of second source lines SL2 may be electrically coupled to the third string ST3 as well as the second ST2. The plurality of third source lines SL3 may be electrically coupled to the fourth vertical strings ST4. The plurality of first bit lines BL1 may be coupled to the first and second vertical strings ST1 and ST2 and the plurality of second bit lines BL2 may be coupled to the third and fourth vertical strings ST3 and ST4.

The second bit lines BL2 may be located between the third memory block MB3 and the fourth memory block MB4. The third source lines SL3 may be located above the fourth memory block MB4. For example, the first and second memory blocks MB1 and MB2 may share the first bit lines BL1, the second and the third memory blocks MB2 and MB3 may share the second source lines SL2, and the third and fourth memory blocks MB3 and MB4 may share the second bit lines BL2.

The second vertical strings ST2 of the second memory block MB2 may be arranged to be symmetrical to the first vertical strings ST1 of the first memory block MB1 based on the first bit lines BL1 so that the first and second memory blocks MB1 and MB2 share the first bit lines BL1. The third vertical strings ST3 of the third memory block MB3 may be arranged to be symmetrical to the second vertical strings ST2 of the second memory block MB2 so that the second and third memory blocks MB2 and MB3 share the second source lines SL2. The fourth vertical strings ST4 of the fourth memory block MB4 may be arranged to be symmetrical to the third vertical strings ST3 of the third memory block MB3 based on the second bit lines BL2 so that the third and fourth memory blocks MB3 and MB4 share the second bit lines BL2.

In addition, the first to third source lines SL1 to SL3 may extend in parallel along the first direction I-I' of the FIG. 2A, and the first and second bit lines BL1 and BL2 may extend in parallel along the second direction II-II' of the FIG. 2A.

Figure 3A:
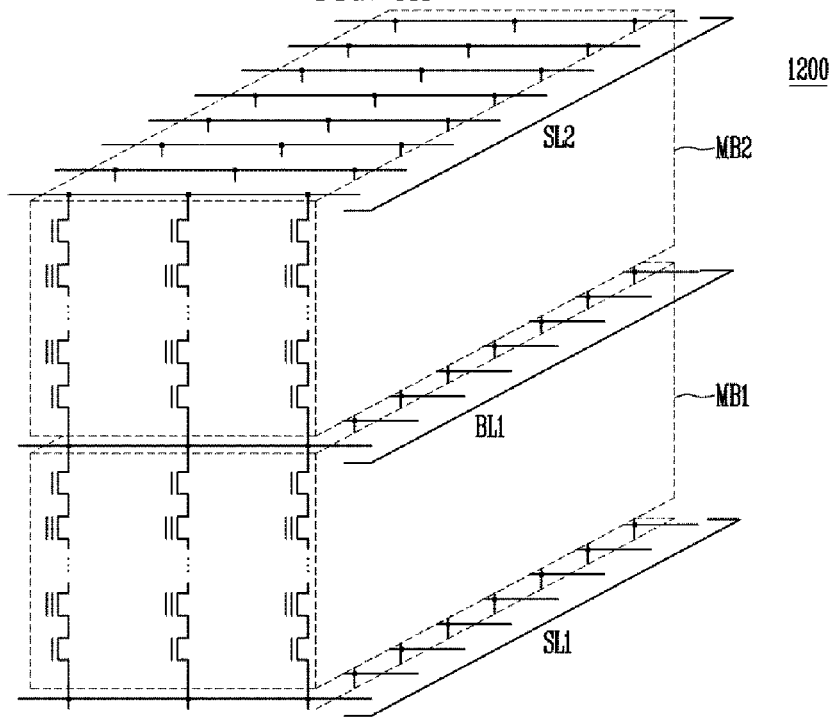
FIGS. 3A and 3B are circuit diagrams of the structure of a semiconductor device according to a third embodiment of the present invention.
Figure 3B:
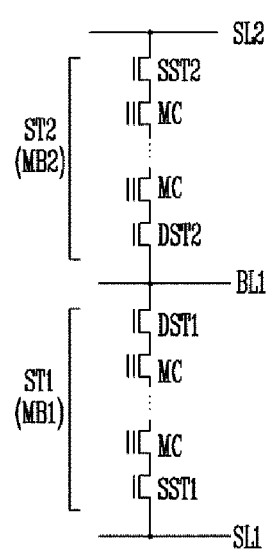

Referring to FIGS. 3A and 3B, the semiconductor device 1200 may include the first and second memory blocks MB1 and MB2, the first source lines SL1, the second source lines SL2 and the first bit lines BL1. The first bit lines BL1 may extend to be parallel to the first and second source lines SL1 and SL2. Here, the first and second source lines SL1 and SL2 may extend in parallel along the first direction I-I' of the FIG. 3A.

Figure 4A:
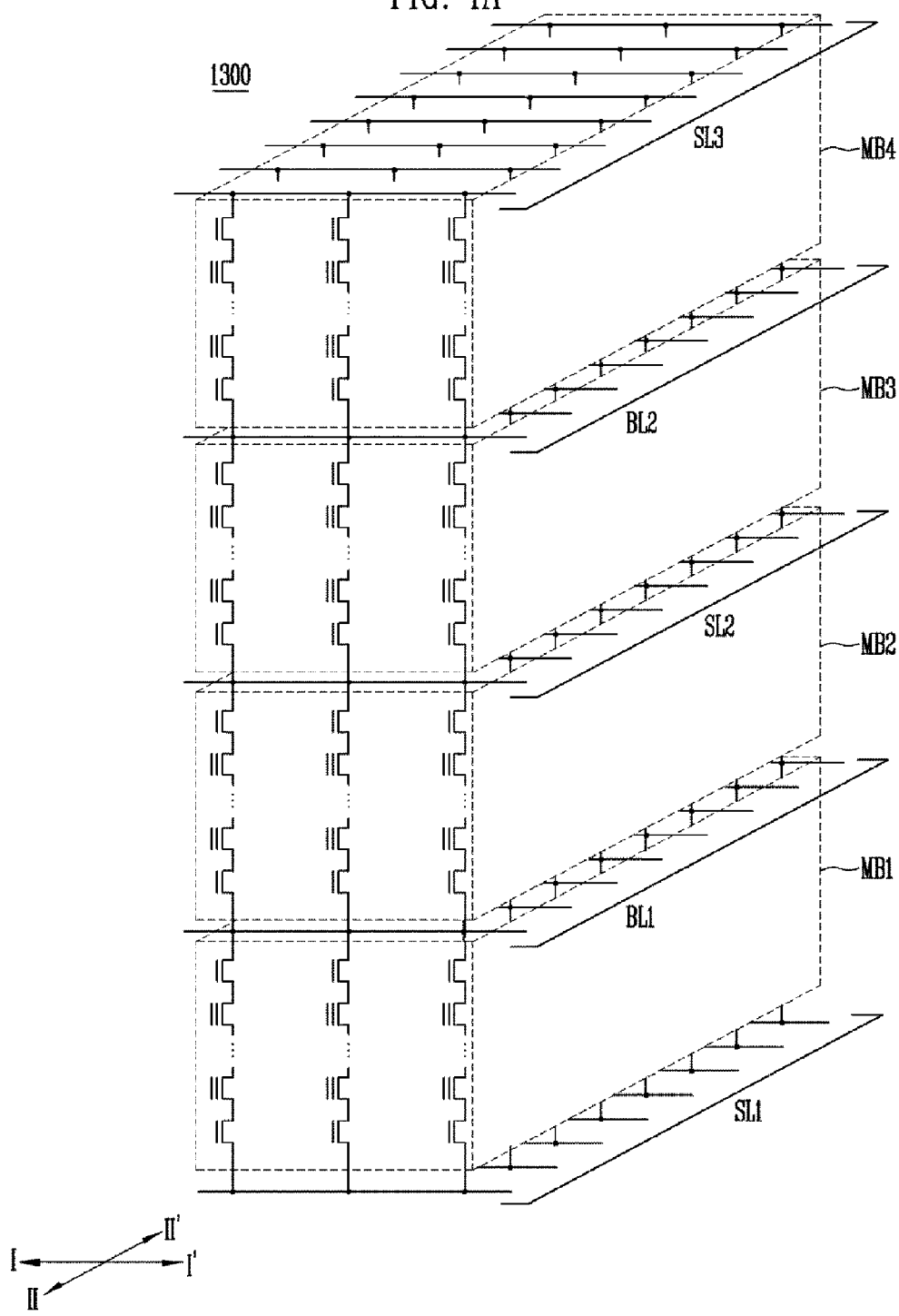
FIGS. 4A and 4B are circuit diagrams of the structure of a semiconductor device according to a fourth embodiment of the present invention.
Figure 4B:
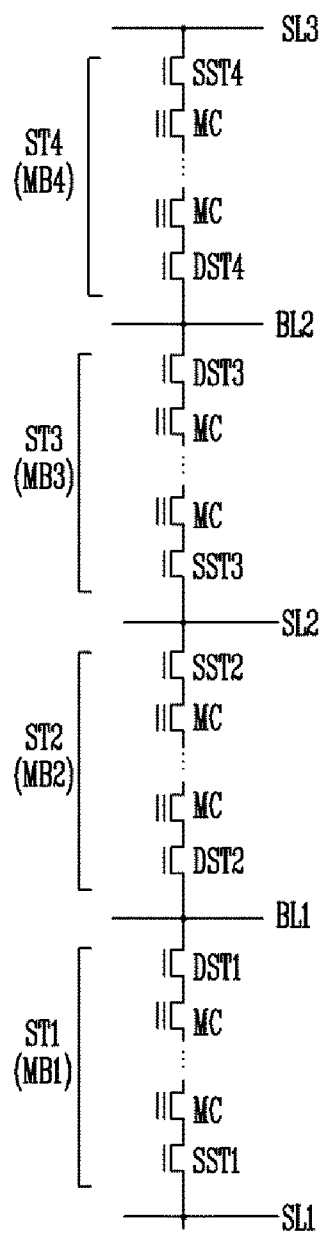

Referring to FIGS. 4A and 4B, the semiconductor device 1300 may include the first to fourth memory blocks MB1 to MB4 sequentially stacked on top of one another, the first to third source lines SL1 to SL3 and the first and second bit lines BL1 and BL2. The first and second bit lines BL1 and BL2 may extend to be parallel to the first to third source lines SL1 to SL3. That is, the first to third source lines SL1 to SL3 may extend in parallel along the first direction I-I'.

The semiconductor device may be fabricated as following process flow.

Figure 5A:
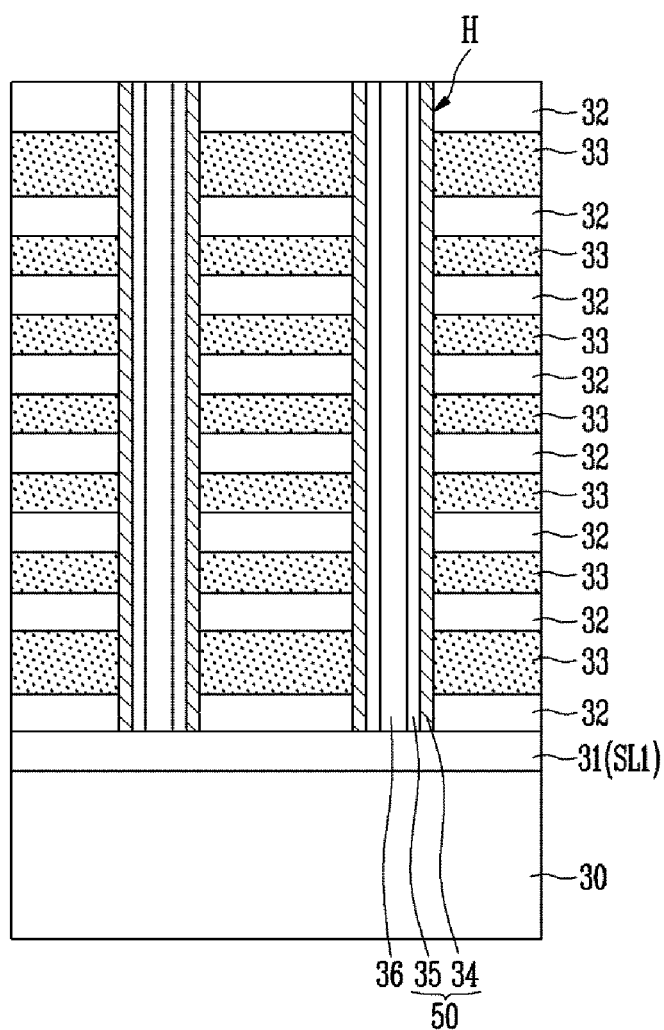
FIGS. 5A to 5D are cross-sectional views illustrating a process flow for manufacturing the semiconductor device according to the first embodiment of the present invention.

As illustrated in FIG. 5A, first source lines 31 (SL1) may be formed on a substrate 30. For example, the first source lines 31 may be formed by doping the substrate 30 with N type or P type impurities or forming a conductive layer on the substrate 30. Here, the first source lines 31 may extend in parallel along one direction.

Subsequently, first material layers 33 and second material layers 32 may be alternately stacked over the substrate 30 where the first source lines 31 are formed. The first material layers 33 may be provided to form control gates or select gates. Among the first material layers 33, at least one lowermost first material layer 33 and at least one uppermost first material layer 33 may be provided to form select gates, and the other first material layers 33 may be provided to form control gates. By taking the characteristics of select transistors into consideration, each of the first material layers 33 provided as select gates may have a different thickness from each of the first material layers 33 provided as control gates. For example, the first material layer 33 provided as a select gate may have a thicker thickness than the first material layer 33 provided as a control gate. The second material layers 32 are provided for electrical isolating between the control gates and the select gates from each other.

The first material layer 33 and the second material layer 32 may include material layers having a high etching selectivity therebetween. For example, the first material layer 33 may include a conductive layer such as a polysilicon layer, and the second material layer 32 may include an insulating layer such as an oxide layer. Further, the first material layer 33 may include a conductive layer such as a doped polysilicon layer or a doped amorphous silicon layer, and the second material layer 32 may include a sacrificial layer such as an undoped polysilicon layer or an undoped amorphous silicon layer. Further, the first material layer 33 may include a sacrificial layer such as a nitride layer, and the second material layer 32 may include an insulating layer such as an oxide layer. In addition, the first material layer 33 may include a first sacrificial layer such as an oxide layer ($SiO_2$), and the second material layer 32 may include a second sacrificial layer such as a nitride layer (SiN).

Hereinafter, a description will be made with reference to an example in which the first material layer 33 includes a first sacrificial layer, and the second material layer 32 includes a second sacrificial layer.

The first material layers 33 and the second material layers 32 may be etched to form channel holes H. The channel holes H may be arranged in a matrix format or a zigzag pattern. In addition, each of the channel holes H may have a circular, oval, rectangular, or polygonal cross-section.

A first memory layer 50 may be formed in each of the channel holes H. For example, the first memory layer 50 may include some or all of the following layers: a charge blocking layer, a charge storage layer and a tunnel insulating layer. In addition, the charge storage layer may include one of, or a combination of a floating gate, such as a polysilicon layer, which can store charge, a trap layer, such as a nitride layer, which can trap charge, and nanodots. For reference, the first material layer may include a phase-change material layer instead of the charge storage layer.

In this embodiment, a floating gate material layer 34 and a tunnel insulating layer 35 are sequentially formed on an inner surface of the channel hole H as the first memory layer 50. Since the floating gate material layer 34 may be uniform in thickness along an inner surface of each channel hole H. Thus, the stacked memory cells may include floating gates having a uniform thickness. The floating gate material layer 34 may include at least one of a polysilicon layer, a metal layer and a silicide layer. In addition, the floating gate material layer 34 may have a thickness of approximately 10 nm or less.

A channel layer 36 may be formed on the tunnel insulating layer 35. The channel layer 36 may include a single layer or a stacked layer. For example, if the channel layer 36 is the stack layer, the floating gate conductive layer 34, the tunnel insulating layer 35 and a first channel layer may be formed along the inner surface of the channel hole H. The floating gate conductive layer 34, the tunnel insulating layer 35 and the first channel layer formed on bottom surfaces of the channel holes H may be etched to expose the first source lines 31. Subsequently, a second channel layer may be formed on the first channel layer to form the channel layer 36.

For reference, the first channel layer may be removed before the second channel layer is formed. In addition, the channel hole H may be completely filled with the second channel layer or formed along sidewalls of the first channel layer (or the tunnel insulating layer 35, if the first channel layer is removed). An open central portion may be generated in the channel hole H, if the second channel layer is formed along the sidewalls of the first channel layer. The open central portion of the channel hole H may be filled with an insulating layer.

Figure 5B:
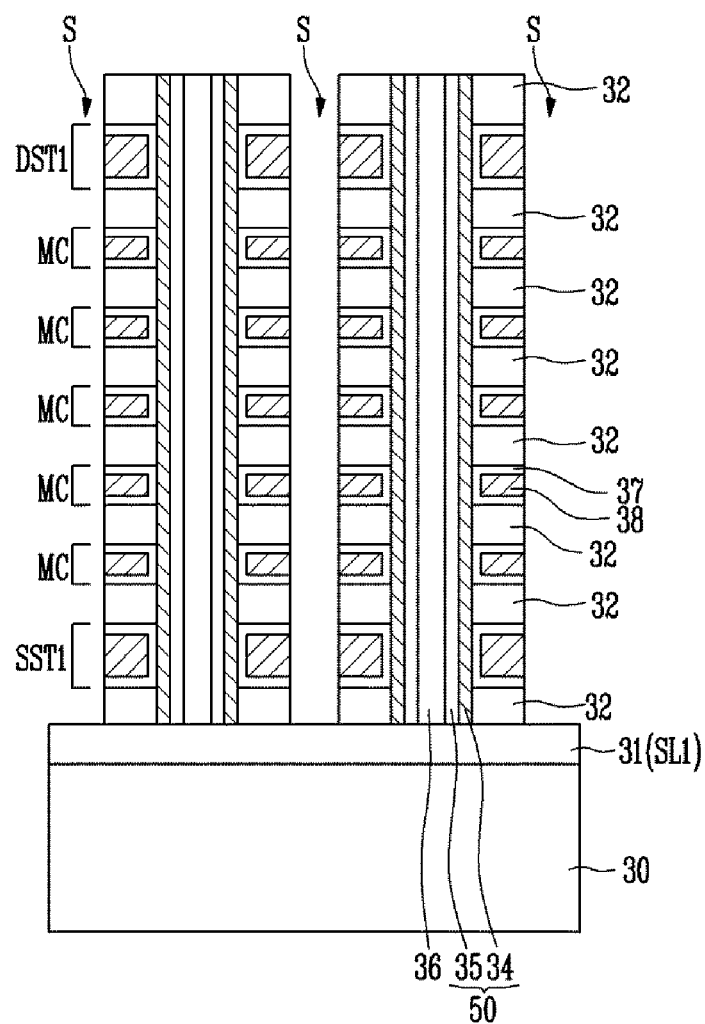

As illustrated in FIG. 5B, the first material layers 33 and the second material layers 32 may be etched to form slits S between the channel holes H. Each of the slits S may be formed between every two channel holes H, or the slits S may be formed between some of the channel holes H.

The first material layers 33 exposed through sidewalls of the slits S may be removed, to form first recessed regions. Subsequently, conductive layers 38 may be formed to fill in the first recessed regions. Each of the conductive layers 38 may include a polysilicon layer or a metal layer such as a tungsten layer.

For reference, before the conductive layers 38 are formed, second memory layers may be formed along the first recessed regions. For example, each of the second memory layers may include some or all of the following layers: a charge blocking layer, a charge storage layer and a tunnel insulating layer. In addition, the charge storage layer may include one of, or a combination of a floating gate, such as a polysilicon layer, which can store charge, a trap layer, such as a nitride layer, which can trap charge, and nanodots. For reference, the second material layer 37 may include a phase-change material layer instead of the charge storage layer.

In this embodiment, charge blocking layers 37 are formed along the first recessed regions as the second memory layers. Each of the charge blocking layers 37 may include any one of, or a combination of, a high-k material layer, such as a hafnium oxide layer (HfO), an oxide layer and a nitride layer.

As a result, at least one source selection transistor SST1, a plurality of memory cells and at least one drain selection transistor DST1 may be stacked along the channel layer 36, that is, along the perpendicular (or vertical) to the surface of the substrate 30.

Figure 5C:
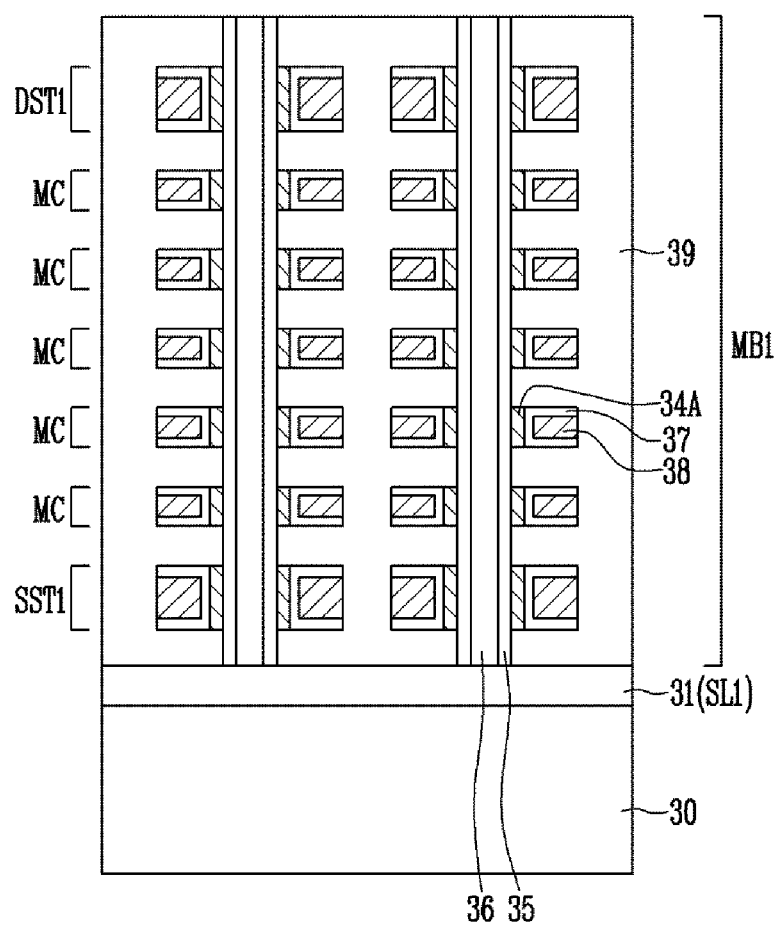

As illustrated in FIG. 5C, the second material layers 32 exposed through the sidewalls of the slits S may be removed to form second recessed regions. Thus, the floating gate material layer 34 may be exposed through the second recessed regions. The exposed floating gate material layer 34 may be selectively removed. That is, the floating gate material layers 34 formed between the stacked memory cells MC may be removed by using an etch process, so that floating gates 34A of the memory cells MC may be separated from each other.

Portions of the floating gates 34A of the memory cells MC may be inadvertently etched during the etch process of the floating gate material layers 34. In order to prevent undesirable etching of the floating gates 34A of the memory cells MC, the thickness of the floating gate material layers 34 may be sufficiently reduced to a thickness of approximately 10 nm or less.

An insulating layer 39 may be formed to fill in the second recessed regions and the slits S. The insulating layer 39 formed in the second recessed regions may be used as an interlayer insulating layer that separates the conductive layers 38, i.e., control gates and select gates, stacked on top of one another, from each other. For reference, an air gap may be formed in at least some of the second recessed regions and the slits S by controlling deposition conditions of the insulating layer 39.

As a result, the first memory block MB1 that includes the first vertical strings ST1 may be formed.

Figure 5D:
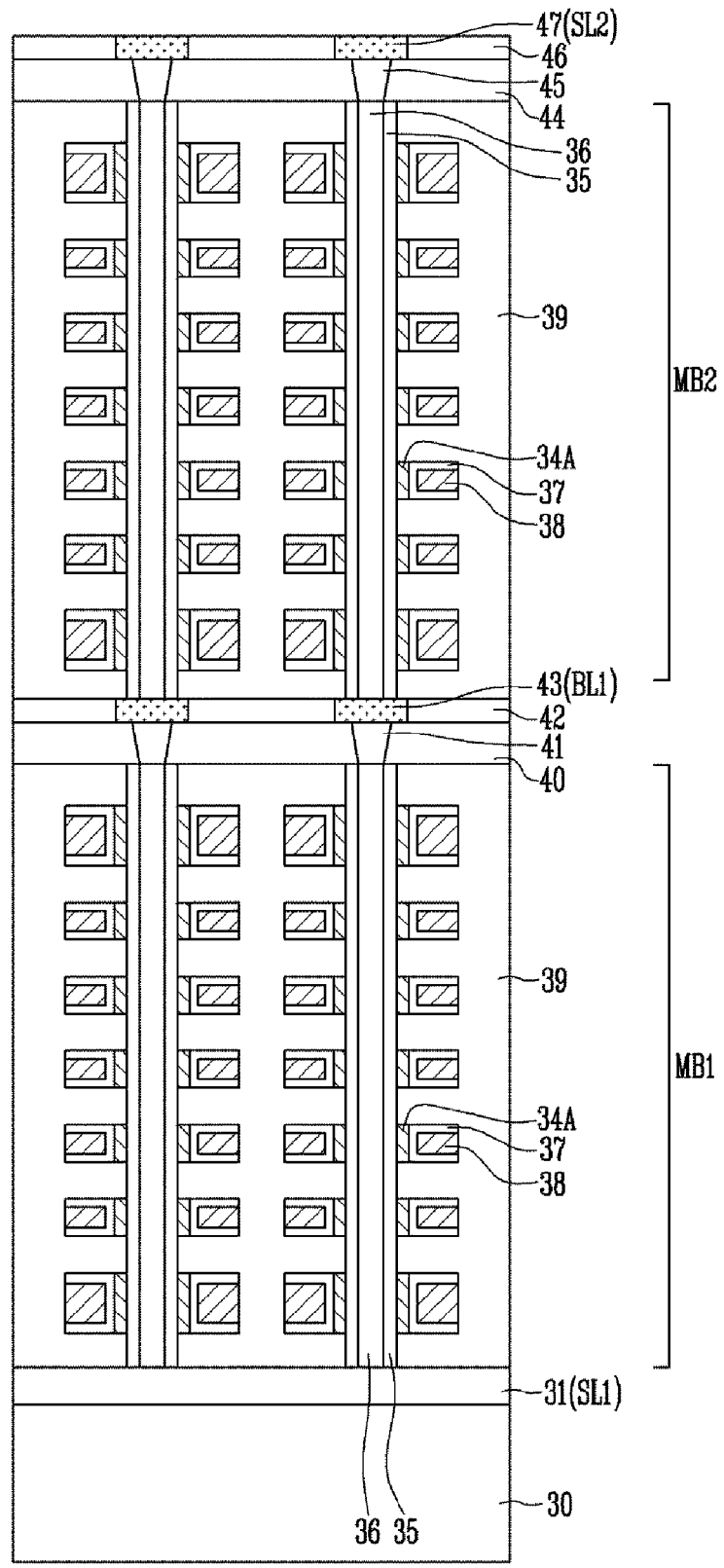

As illustrated in FIG. 5D, a first interlayer insulating layer 40 may be formed on the first memory block MB1. The first contact plugs 41 may be formed through the first interlayer insulating layer 40 to be coupled to the channel layers 36. Subsequently, a second interlayer insulating layer 42 may be formed on the first interlayer insulating layer 40 having the first contact plugs 41. Trenches may be formed in the second interlayer insulating layer 42, by etching the second interlayer insulating layer 42, to be exposed the first contact plugs 41. Subsequently, the trenches may be filled with conductive layers to form first bit lines 43. The first bit lines 43 may be formed in parallel with the first source lines 31 or cross the first source lines 31 The second memory block MB2 may be formed over the second interlayer insulating layer 42 including the first bit lines 43. The second memory block MB2 may be manufactured using substantially the same method as that used for the first memory block MB1. The second memory block MB2 may be formed so that the channel layers 36 of the second memory block MB2 are electrically connected to the first bit lines 43.

A third interlayer insulating layer 44 may be formed on the second memory block MB2. Second contact plugs 45 may be formed through the third interlayer insulating layer 44 to be coupled to upper surfaces of the channel layers 36 of the second memory block MB2. A fourth interlayer insulating layer 46 may be formed on the third interlayer insulating layer 44 including the second contact plugs 45. Trenches may be formed in the fourth interlayer insulating layer 44 by etching the fourth interlayer insulating layer 46. Subsequently, the trenches may be filled with conductive layers to form second source lines 47. The second source lines 47 may be formed in parallel with the first source lines 31 and the first bit lines 43. Alternatively, the first and second source lines 31 and 47 may be formed in parallel along one direction, and the first bit lines 43 may be formed in parallel along another direction crossing the first and second source lines 31 and 47.

According to the aforementioned embodiments, a degree of integration of the memory device may be improved by stacking the memory blocks MB1 and MB2 one on top of the other. In addition, the charge storage layer may have a uniform thickness, and the charge storage layer of stacked memory cells may be separated, thereby improving data retention characteristics.

Meanwhile, a description has been made with reference to an example the conductive layers 38 are formed in areas in which the first material layers 33 were formed, and then the second material layers 32 are subsequently removed. Further, the insulating layer 39 is formed in areas in which the second material layers 32 were formed, and then the first material layers 33 may be removed.

For reference, various changes may be made to the aforementioned manufacturing processes, depending on types of the first material layers 33 and the second material layers 32.

For example, the first material layers 33 may be formed of conductive layers, and the second material layers 32 may be formed of interlayer insulating layers. In this case, after slits are formed, a silicidation of the first material layers 33 exposed through the slits may be performed. Here, processes of forming first and second recessed regions may be skipped.

In an example, the first material layers 33 may be formed of conductive layers, and the second material layers 32 may be formed of sacrificial layers which have an etching selectivity being different from the first material layers 33. In this case, a process of forming first recessed regions may be skipped, while second recessed regions may be formed. Here, as described above, after slits are formed, a silicidation of the first material layers 33 exposed through the slits may be further performed.

In an example, the first material layers 33 may be formed of sacrificial layers, and the second material layers 32 may be formed of interlayer insulating layers. In this case, a process of forming second recessed regions may be skipped.

A description has been made to a process of simultaneously forming at least one source selection transistor, a plurality of memory cells and at least one drain selection transistor, which are sequentially stacked on top of one another along the channel layer 36. In addition, at least one source selection transistor, a plurality of memory cells and at least one drain selection transistor may be formed through different processes.

Figure 6A:
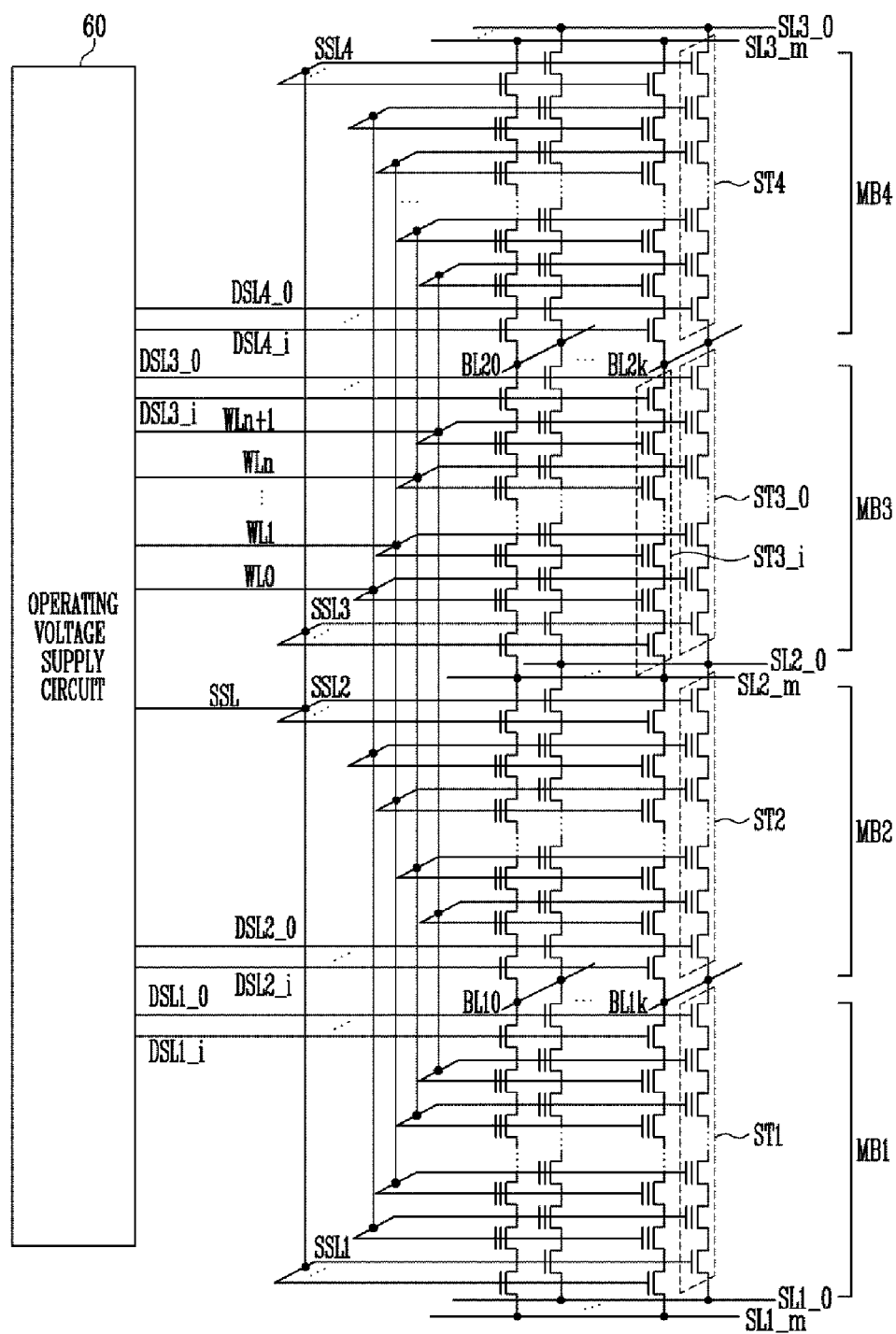

Referring to FIGS. 6A and 6B, source lines and bit lines may configured to extend in directions crossing each other, first to fourth source selection lines SSL1 to SSL4 of the first to fourth memory blocks MB1 to MB4 stacked on top of one another may be equally controlled, and first to third source lines SL1_m to SL3_m are separately controlled.

More detailed, as illustrated in FIG. 6A, a semiconductor device 1400 may include the first to fourth memory blocks MB1 to MB4, the first and second bit lines BL10 to BL1k and BL20 to BL2k, and the first to third source lines SL1_0 to SLm, SL2_0 to SL2_m and SL3_0 to SL3_m.

Select gates of source selection transistors included in the first to fourth memory blocks MB1 to MB4 may be electrically coupled to one another and controlled by a single source selection line SSL. In addition, the first to fourth vertical strings ST1 to ST4 included in the first to fourth memory blocks MB1 to MB4 may be controlled by a plurality of drain selection lines DSL1_0 to DSL1_i, DSL2_0 to DSL2_i, DSL3_0 to DSL3_i and DSL4_0 to DSL4_i, respectively.

Control gates of memory cells of the first to fourth memory blocks MB1 to MB4 may be coupled to each other according to one another. For example, the control gates of first memory cells of the first to fourth memory blocks MB1 to MB4 may be couple to each other and controlled by a first word line WL0. Control gates of n-th memory cells of the first to fourth memory blocks MB1 to MB4 may be coupled to each other and controlled by an n-th word line WLn−1.

According to the above-described structure of the semiconductor device, the first to fourth memory blocks MB1 to MB4 may share an operating voltage supply circuit 60. The operating voltage supply circuit 60 may include a word line driver and a selection line driver. Therefore, the number of operating voltage supply circuits 60 may be reduced, and space occupied by the operating voltage supply circuit 60 in the semiconductor device may be accordingly reduced. As illustrated in FIG. 6B, the first to third source lines SL1_m to SL3_m may be separately controlled. For example, the first to third source lines SL1_m to SL3_m may be separately controlled by a signal supplied from an SL voltage supply circuit 63. The SL voltage supply circuit 63 may be included in the operating voltage supply circuit 60. Though not illustrated in FIG. 6B, the SL voltage supply circuit 63 may include a switch and be configured to apply operating voltages, e.g., a ground voltage, a voltage Vcc and an erase voltage to the first to third source lines SL1_m to SL3_m in response to a signal supplied to the switch.

The first and second memory blocks MB1 and MB2 may share the first bit lines BL1, and the third and fourth memory blocks MB3 and MB4 may share the second bit lines BL2. The first bit lines BL1 and the second bit lines BL2 may be coupled to the switch SW. The switch SW may include at least four transistors N1 to N4 and couple the first and second bit lines BL1 and BL2 to a BL voltage supply circuit 61 or a read/write circuit 62 in response to a signal /BL_SEL or BL/SEL supplied to the transistors N1 to N4.

According to the above-described structure of the semiconductor device, the first to fourth memory blocks MB1 to MB4 may share the BL voltage supply circuit 61, the read/write circuit 62 and the SL voltage supply circuit 63. The read/write circuit 62 may be a page buffer. As a result, the number of BL voltage supply circuits 61, read/write circuits 62 and SL voltage supply circuits 63 may be reduced. Therefore, space occupied by these circuits in the semiconductor device may be reduced.

Referring to Table 1, a read operation, a program operation and an erase operation of the semiconductor device, illustrated in FIGS. 6A and 6B are described below. For illustration purposes, the operating voltage supply circuit 60, the BL voltage supply circuit 61, the read/write circuit 62 and the SL voltage supply circuit 63 are collectively referred to as an operation circuit.

TABLE 1

| | | Read | Program | Erase |
|---|---|---|---|---|
| MB4 (ST4) Un-Selected Block (string), Common BL, common WLs | BL2k | 1V | Vcc -> 0V/Vcc | Floating |
| | DSL4 | 0V | 5V -> 0V or -2V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL4 | 4V | 0V or -2V | Vera(8V) |
| | SL3 | 0V | Vcc | Vera(8V) |

| | | Read | Program | Erase |
|---|---|---|---|---|
| MB3 (SEL_ST3) Selected Block (string) | BL2k_0 | 1V | Vcc -> 0V/Vcc | Floating |
| | DSL3_0 | 4V | 5V -> 1.5V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL3 | 4V | 0V or -2V | Vera(8V) |
| | SL2 | 0V | Vcc | Vera(8V) |

| | | Read | Program | Erase |
|---|---|---|---|---|
| MB3 (UNSEL_ST3) Selected Block (string), Common BL, Common SL, Common WLs | BL2k | 1V | Vcc -> 0V/Vcc | Floating |
| | DSL3_i | 0V | 5V > 0V or 2V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL3 | 4V | 0V or -2V | Vera(8V) |
| | SL2 | 0V | Vcc | Vera(8V) |

| | | Read | Program | Erase |
|---|---|---|---|---|
| MB2 (ST2) Un-Selected Block (string), Common SL, common WLs | BL1k | 0V | Vcc | Floating |
| | DSL2 | 0V | 5V > 0V or -2V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL2 | 4V | 0V or -2V | Vera(8V) |
| | SL2 | 0V | Vcc | Vera(8V) |

| | | Read | Program | Erase |
|---|---|---|---|---|
| MB1 (ST1) Un-Selected Block (string), Common SL, Common WLs | BL1k | 0V | Vcc | Floating |
| | DSL1 | 0V | 5V -> 0V or -2V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL1 | 4V | 0V or -2V | Vera(8V) |
| | SL1 | 0V | Vcc | 0V |

| | | Read | Program | Erase |
|---|---|---|---|---|
| MB4-1 (ST4) Un-Selected Block (string) Common BL | BL2k | 1V | 0V/Vcc | Floating |
| | DSL4 | 0V | 0V or -2V | 0V |
| | WLn+1 | 0V | 0V | 0V |
| | WLn | 0V | 0V | 0V |
| | WL0 | 0V | 0V | 0V |
| | SSL4 | 0V | 0V | 0V |
| | SL3 | 0V | 0V | 0V |

| | | Read | Program | Erase |
|---|---|---|---|---|
| MB3-1 (ST3) Un-Selected Block (string) Common BL | BL2k | 1V | 0V/Vcc | Floating |
| | DSL3 | 0V | 0V or -2V | 0V |
| | WLn+1 | 0V | 0V | 0V |
| | WLn | 0V | 0V | 0V |
| | WL0 | 0V | 0V | 0V |
| | SSL3 | 0V | 0V | 0V |
| | SL2 | 0V | 0V | 0V |

| | | Read | Program | Erase |
|---|---|---|---|---|
| MB2-1 (ST2) Un-Selected Block (string) | BL1k | 0V | 0V | Floating |
| | DSL2 | 0V | 0V or -2V | 0V |
| | WLn+1 | 0V | 0V | 0V |
| | WLn | 0V | 0V | 0V |
| | WL0 | 0V | 0V | 0V |
| | SSL2 | 0V | 0V | 0V |
| | SL2 | 0V | 0V | 0V |

| | | Read | Program | Erase |
|---|---|---|---|---|
| MB1-1 (ST1) Un-Selected Block (string) | BL1k | 0V | 0V | Floating |
| | DSL1 | 0V | 0V or -2V | 0V |
| | WLn+1 | 0V | 0V | 0V |
| | WLn | 0V | 0V | 0V |
| | WL0 | 0V | 0V | 0V |
| | SSL1 | 0V | 0V | 0V |
| | SL1 | 0V | 0V | 0V |

The first column of Table 1 shows voltage conditions for a case in which the third memory block MB3 is selected from among the first to fourth memory blocks MB1 to MB4 sequentially stacked on top of one another, and more specifically, voltage conditions of a selected third vertical string ST3_0 of the third memory block MB3. The second column shows voltage conditions of an unselected vertical string ST3_i among third vertical strings ST3_0 to ST3_i included in the selected third memory block MB3. In addition, the third column shows voltage conditions of unselected 1-1 to 4-1 memory blocks MB1-1 to MB4-1.

First, a read operation is described below.

During a read operation of the selected third memory block MB3 including the selected vertical string ST3_0, the operation circuit may apply a precharge voltage (e.g., 1V) to the second bit line BL2k, apply a power voltage (e.g., Vcc) to the first and third source lines SL1_m and SL3_m, apply a ground voltage (e.g., 0V) to the second source line SL2_m. The operation circuit may apply a voltage (e.g., 4V) to turn on a drain selection transistor to the third drain selection line DSL3_0 and apply a voltage (e.g., 4V) to turn on a source selection transistor to the first to fourth source selection lines SSL1 to SSL4. When the operation circuit applies a read voltage Vread to a selected word line SEL_WL and applies a read pass voltage Vpass_read to unselected word lines, a voltage level of the second bit line BL2k may be reduced or maintained by a threshold voltage of a memory cell coupled to a selected word line SEL_WL. The operation circuit may sense a variation in the voltage level of the second bit line BL2k, latch data stored in the memory cell according to the sensing result and output the latched data.

At this time, the operation circuit may apply a ground voltage (e.g., 0V) to a third drain selection line DSL3_i coupled to the unselected vertical string ST3_i in order to suppress a disturbance of the unselected vertical string ST3_i, among the third vertical strings ST3_0 to ST3_i included in the selected third memory block MB3.

In addition, the operation circuit may apply a ground voltage (e.g., 0V) to the first, second and fourth drain selection lines DSL1_0 to DSL1_i, DSL2_0 to DSL2_i and DSL4_0 to DSL4_i of the unselected first, second and fourth memory blocks MB1, MB2 and MB4, respectively. In addition, the operation circuit may apply a ground voltage (e.g., 0V) to the first bit lines BL10 to BL1k.

A program operation is described below.

During a program operation of the selected third memory block MB3, the operation circuit may apply a precharge voltage (e.g., 1V) to the second bit line BL2k, or apply the precharge voltage and subsequently discharge the voltage loaded in the second bit line BL2K in response to data stored in memory cells. The operation circuit may apply a power voltage (e.g., Vcc) to the first to third source lines SL1 to SL3, apply a high voltage (e.g., 5V) to the third drain selection line DSL3_0 when the precharging of the second bit line BL2k is completed, and subsequently apply a voltage having a normal level (e.g., 1.5V) when the precharging of the second bit line BL2k is completed. The operation circuit may apply a ground voltage (e.g., 0V) or a negative voltage (e.g., −2V) to the third source selection line SSL3. In addition, when the operation circuit applies a program voltage Vpgm to the selected word line SEL_WL and a program pass voltage Vpass_pgm to the unselected word lines, the threshold voltage of the memory cell coupled to the selected word line SEL_WL may be increased or maintained according to whether the second bit line BL2k is in a discharge state or a precharge state. The operation circuit may perform a program verify operation to detect whether or not the threshold voltage of the memory cell has increased to a target level.

An erase operation is described below.

During an erase operation of the selected third memory block MB3, the operation circuit may set the second bit line BL2k to a floating state, apply a ground voltage (e.g., 0V) to the first and third source lines SL1_m and SL3_m and apply a positive voltage (e.g., 8V) corresponding to an erase voltage Verase to the second source lines SL2_m. The erase voltage Verase may be applied to channels of the memory cells included in the selected memory block so as to perform the erase operation. In addition, the operation circuit may apply a ground voltage (e.g., 0V) to the third drain selection line DSL3 and apply a positive voltage (e.g., 8V) corresponding to the erase voltage Verase to the third source selection line SSL3. In addition, when the operation circuit applies a negative voltage (e.g., −10V) to word lines WL0 to WLn+1 of the selected third memory block MB3, threshold voltages of memory cells may be reduced. Subsequently, the operation circuit may perform an erase verify operation to detect whether or not the threshold voltages of the memory cells have decreased to a target level.

In addition, the operation circuit may apply a positive voltage (e.g., 8V) corresponding to the erase voltage Verase to the first, second and fourth source selection lines SSL1_0 to SSL1_i, SSL2_0 to SSL2_i and SSL4_0 to SSL4_i of the unselected first, second and fourth memory blocks MB1, MB2 and MB4, respectively.

Meanwhile, during the read operation, the program operation and the erase operation, a ground voltage (e.g., 0V) may be applied to the word lines WL0 to WLn of the unselected 1-1 to 4-1 memory blocks MB1-1 to MB4-1.

Figure 7A:
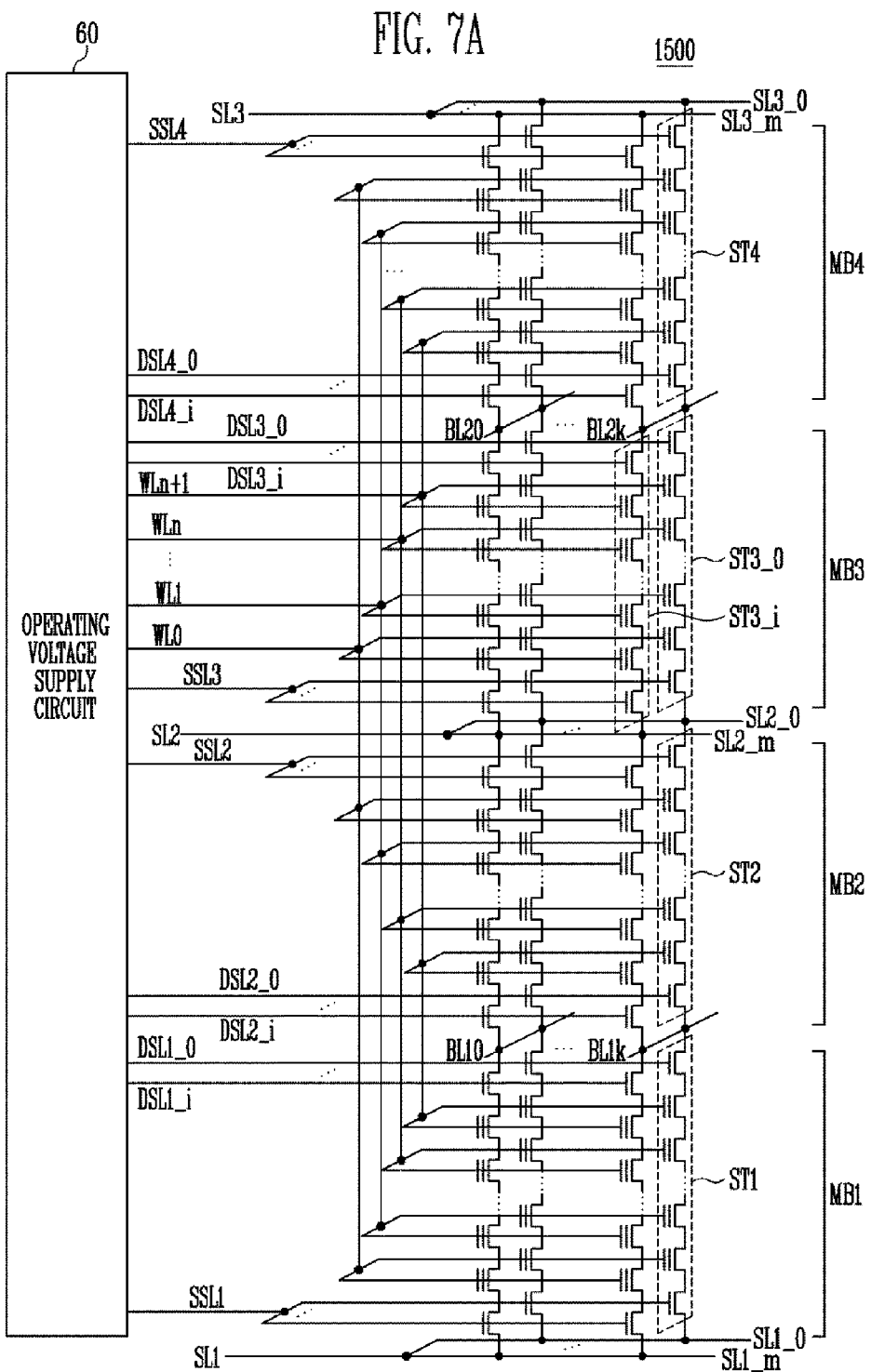
FIGS. 7A and 7B are circuit diagrams of a semiconductor device according to another embodiment of the present invention.
Figure 7B:
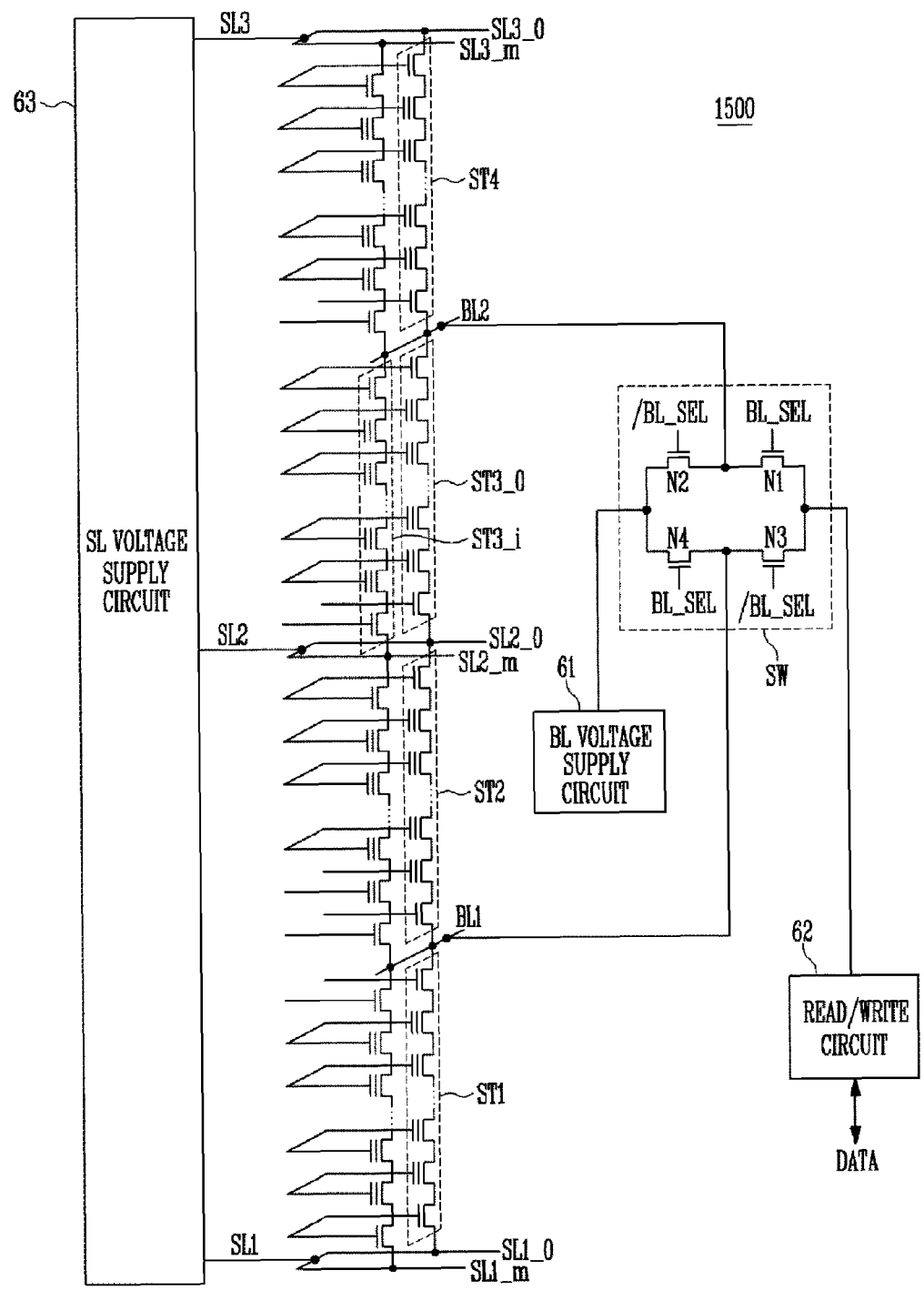

As illustrated in FIGS. 7A and 7B, a semiconductor device 1500 may include source lines SL1 to SL3 and bit lines BL10 to BL2k that extend in directions crossing each other. In addition, source selection lines SSL1 to SSL4 of the first to fourth memory blocks MB1 to MB4 stacked on top of one another may be separately controlled, and the source lines SL1 to SL3 may be separately controlled. That is, the source selection lines SSL1 to SSL4 are independently received voltages from the operating voltage supply circuit 60, respectively. Further, the source lines SL1_0 to SL1, SL2_0 to SL2_m, SL3_0 to SL3_m and SL4_0 to SL4_m are electrically coupled to the source line SL1, SL2, SL3 and SL4, respectively.

Therefore, during the read operation, different voltages may be applied to the source lines SL1 and SL3 from the SL voltage supply circuit 63. Except for this difference, the structure of the semiconductor device 1500, illustrated in FIGS. 7A and 7B, is substantially the same as that of the above-described semiconductor device. Thus, a description of the structure of the semiconductor device illustrated in FIGS. 7A and 7B the same as that of the above-described semiconductor device is omitted.

Hereinafter, a read operation, a program operation and an erase operation of the semiconductor device as illustrated in FIGS. 7A and 7B are described with reference to Table 2. The operating voltage supply circuit 60, the BL voltage supply circuit 61, the read/write circuit 62 and the SL voltage supply circuit 63 are collectively referred to as an operation circuit.

TABLE 2

| MB4 (ST4) Un-Selected Block (string), Common BL, common WLs | | Read | Program | Erase |
|---|---|---|---|---|
| | BL2k | 1V | Vcc -> 0V/Vcc | Floating |
| | DSL4 | 0V | 0V or -2V | 0V |
| | WLn+1 | 0V | 0V | 0V |
| | WLn | 0V | 0V | 0V |
| | WL0 | 0V | 0V | 0V |
| | SSL4 | 0V | 0V | 0V |
| | SL3 | 0V | 0V | 0V |

| MB3 (SEL_ST3) Selected Block (string) | | Read | Program | Erase |
|---|---|---|---|---|
| | BL2k_0 | 1V | Vcc -> 0V/Vcc | Floating |
| | DSL3_0 | 4V | 5V -> 1.5V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL3 | 4V | 0V or -2V | Vera(8V) |
| | SL2 | 0V | Vcc | Vera(8V) |

| MB3 (UNSEL_ST3) Selected Block (string), Common BL, Common SL, Common WLs | | Read | Program | Erase |
|---|---|---|---|---|
| | BL2k | 1V | Vcc -> 0V/Vcc | Floating |
| | DSL3_i | 0V | 5V > 0V or -2V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL3 | 4V | 0V or -2V | Vera(8V) |
| | SL2 | 0V | Vcc | Vera(8V) |

| MB2 (ST2) Un-Selected Block (string), Common SL, common WLs | | Read | Program | Erase |
|---|---|---|---|---|
| | BL1k | Vcc | Vcc | Floating |
| | DSL2 | 4V | 5V > 0V or -2V | 0V |
| | WLn+1 | Vpass_read | Vpass_prgm | 10V |
| | WLn | Vr | Vpgm | 10V |
| | WL0 | Vpass_read | Vpass_prgm | -10V |
| | SSL2 | 0V | 0V or -2V | Vera(8V) |
| | SL2 | 0V | Vcc | Vera(8V) |

| MB1 (ST1) Un-Selected Block (string), Common SL, common WLs | | Read | Program | Erase |
|---|---|---|---|---|
| | BL1k | Vcc | Vcc | Floating |
| | DSL1 | 4V | 5V > 0V or -2V | 0V |
| | WLn+1 | Vpass_read | Vpass_prgm | -10V |
| | WLn | Vr | Vpgm | -10V |
| | WL0 | Vpass_read | Vpass_prgm | -10V |
| | SSL1 | 0V | 0V or -2V | 0V or -2V |
| | SL1 | 0V | 0V | 0V |

| MB4-1 (ST4) Un-Selected Block (string), Common BL | | Read | Program | Erase |
|---|---|---|---|---|
| | BL2k | 1V | Vcc -> 0V/Vcc | Floating |
| | DSL4 | 0V | 0V or -2V | 0V |
| | WLn+1 | 0V | 0V | 0V |
| | WLn | 0V | 0V | 0V |
| | WL0 | 0V | 0V | 0V |
| | SSL4 | 0V | 0V | 0V |
| | SL3 | 0V | 0V | 0V |

| MB3-1 (ST3) Un-Selected Block (string), Common BL | | Read | Program | Erase |
|---|---|---|---|---|
| | BL2k | 1V | Vcc -> 0V/Vcc | Floating |
| | DSL3 | 0V | 0V or -2V | 0V |
| | WLn+1 | 0V | 0V | 0V |
| | WLn | 0V | 0V | 0V |
| | WL0 | 0V | 0V | 0V |
| | SSL3 | 0V | 0V | 0V |
| | SL2 | 0V | 0V | 0V |

| MB2-1 (ST2) Un-Selected Block (string) | | Read | Program | Erase |
|---|---|---|---|---|
| | BL1k | 0V | 0V | Floating |
| | DSL2 | 0V | 0V or -2V | 0V |
| | WLn+1 | 0V | 0V | 0V |
| | WLn | 0V | 0V | 0V |
| | WL0 | 0V | 0V | 0V |
| | SSL2 | 0V | 0V | 0V |
| | SL2 | 0V | 0V | 0V |

| MB1-1 (ST1) Un-Selected Block (string) | | Read | Program | Erase |
|---|---|---|---|---|
| | BL1k | Vcc | Vcc | Floating |
| | DSL2 | 0V | 0V or -2V | 0V |
| | WLn+1 | 0V | 0V | 0V |
| | WLn | 0V | 0V | 0V |
| | WL0 | 0V | 0V | 0V |
| | SSL1 | 0V | 0V | 0V |
| | SL1 | 0V | 0V | 0V |

In Table 2, the first column shows voltage conditions for a case in which the third memory block MB3 is selected from among the first to fourth memory blocks MB1 to MB4 that are sequentially stacked on top of one another, and more specifically, voltage conditions of the selected third vertical string ST3_0 of the third memory block MB3. The second column shows voltage conditions of the unselected vertical string ST3_i, among the third vertical strings ST3_0 to ST3_i of the selected third memory block MB3. In addition, the third column shows voltage conditions of the unselected 1-1 to 4-1 memory blocks MB1-1 to MB4-1.

First, a read operation is described below.

During a read operation of the selected third memory block MB3 including the selected vertical string ST3_0, the operation circuit may apply a precharge voltage (e.g., 1V) to the second bit line BL2k and apply a ground voltage (e.g., 0V) to the second source line SL2. The operation circuit may apply a voltage (e.g., 4V) to turn on a drain selection transistor to the third drain selection line DSL3_0 and apply a voltage (e.g., 4V) to turn on a source selection transistor to the third source selection line SSL3. When the operation circuit may apply the read voltage Vread to the selected word line SEL_WL and the read pass voltage Vpass_read to the unselected word lines, a voltage of the second bit line BL2k may be reduced or maintained in response to a threshold voltage of a memory cell coupled to the selected word line SEL_WL. The operation circuit may sense a variation in a voltage level of the second bit line BL2k, latch data stored in the memory cell and output the latched data.

The operation circuit may apply a ground voltage (e.g., 0V) to the third drain selection line DSL3_i coupled to the unselected vertical string ST3_i in order to suppress a disturbance of the unselected vertical string ST3_i among the third vertical strings ST3_0 to ST3_i included in the selected third memory block MB3.

In addition, the operation circuit may apply a power voltage (e.g., Vcc) to the first bit lines BL10 to BL1k, apply the voltage (e.g., 4V) to turn on a drain selection transistor to the first and fourth second drain selection lines DSL1_0 to DSL1_i and DSL2_0 to DSL2_i and apply a ground voltage (e.g., 0V) to the fourth drain selection lines DSL4_0 to DSL4_i. In addition, the operation circuit may apply a power voltage (e.g., Vcc) to the third source line SL3, apply a ground voltage (e.g., 0V) to the first and second source selection lines SSL1 and SSL2 and apply a power voltage (e.g., Vcc) to the third and fourth source selection lines SSL3 and SSL4.

By using the above-described driving method, since the power voltage Vcc is supplied to a bit line or a source line to thereby charge a string voltage, disturbance of unselected strings may be reduced.

A program operation is described below.

During a program operation of the selected third memory block MB3, the operation circuit may apply a precharge voltage (e.g., 1V) to the second bit line BL2k, or apply the precharge voltage and subsequently discharge the voltage loaded in the second bit line BL2k in response to the data stored in the memory cell. The operating circuit may apply a power voltage (e.g., Vcc) to the first to third source lines SL1 to SL3. The operating circuit may apply a high voltage (e.g., 5V) to the third drain selection line DSL3_0 when the second bit line BL2k is precharged and subsequently apply a voltage having a normal level (e.g., 1.5V) when the precharging of the second bit line BL2k is completed. The operation circuit may apply a ground voltage (e.g., 0V) or a negative voltage (e.g., −2V) to the third source selection line SSL3. In addition, when the operation circuit applies the program voltage Vpgm to the selected word line SEL_WL and the program pass voltage Vpass_pgm to the unselected word lines, the threshold voltage of the memory cell coupled to the selected word line SEL_WL may be increased or maintained according to whether the second bit line BL2k is in a discharge state or a precharge state. Subsequently, the operation circuit may perform a program verify operation to detect whether or not the threshold voltage of the memory cell has increased to a target level.

By using the above-described driving method, since the power voltage Vcc is applied to the source line to thereby charge a string voltage, the disturbance of unselected vertical strings may be reduced.

An erase operation is described below.

During an erase operation of the selected third memory block MB3, the operation circuit may set the second bit line BL2k to a floating state, apply a ground voltage (e.g., 0V) to the first and third source lines SL1 and SL3. The operating circuit may apply a positive voltage (e.g., 8V) corresponding to the erase voltage Verase to the second source line SL2. The operation circuit may apply a ground voltage (e.g., 0V) to the third drain selection line DSL3 and apply a positive voltage (e.g., 8V) corresponding to the erase voltage to the third source selection line SSL3. In addition, when the operation circuit applies a negative voltage (e.g., −10V) to the word lines WL0 to WLn+1 of the selected third memory block MB3, threshold voltages of memory cells may be reduced. Subsequently, the operation circuit may perform an erase verify operation to detect whether or not the threshold voltages of the memory cells have decreased to a target level.

In addition, the operation circuit may apply a ground voltage (e.g., 0V) or a negative voltage (e.g., −2V) to the first, second and fourth source selection lines SSL1, SSL2 and SSL4 to the unselected first, second and fourth memory blocks MB1, MB2 and MB4.

During the read operation, the program operation and the erase operation, a ground voltage (e.g., 0V) may be applied to the word lines WL0 to WLn of the unselected 1-1 to 4-1 memory blocks MB1-1 to MB4-1.

Figure 8A:
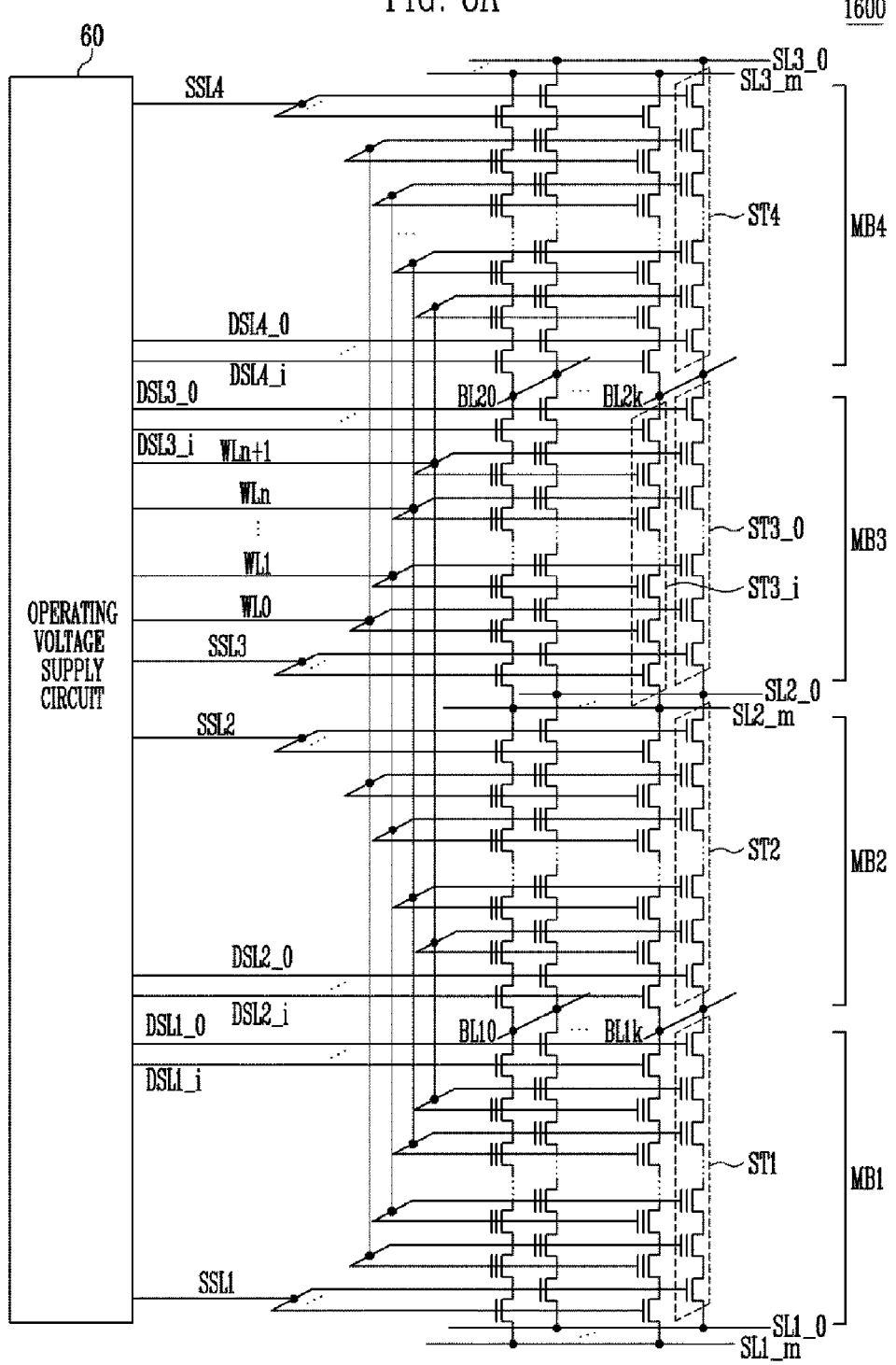

As illustrated in FIGS. 8A and 8B, a semiconductor device 1600 include source lines SL1 to SL3 and bit lines BL10 to BL2k that extend in directions crossing each other. The source selection lines SSL1 to SSL4 may be separately controlled, and the source lines SL1 to SL3 may be separately controlled. That is, the source selection lines SSL1 to SSL4 and the source lines SL1_0 to SL1_m, SL2_0 to SL2_m, SL3_0 to SL3_m and SL4_0 to SL4_m may be independently receive voltages from the operating voltage supply circuit 60. Therefore, during a read operation, different voltages may be applied to the source selection lines SSL1 to SSL4 from the operating voltage supply circuit 60. Except for this difference, the structure of the semiconductor device, illustrated in FIGS. 8A and 8B, is substantially the same as that of the above-described semiconductor. Thus, a description of the structure of the semiconductor device, illustrated in FIGS. 8A and 8B, the same as those of the above-described semiconductor device is omitted.

Hereinafter, a read operation, a program operation and an erase operation of the semiconductor device as illustrated in FIGS. 8A and 8B are described with reference to Table 3. For illustration purposes, the operating voltage supply circuit 60, the BL voltage supply circuit 61, the read/write circuit 62 and the SL voltage supply circuit 63 are collectively referred to as an operation circuit.

TABLE 3

MB4 (ST4) Un-Selected Block (string), Common BL, common WLs

|  | Read | Program | Erase |
|---|---|---|---|
| BL2k | 1V | Vcc -> 0V/Vcc | Floating |
| DSL4 | 0V | 5V -> 0V or -2V | 0V |
| WLn+1 | Vpass_read | Vpass_prgm | -10V |
| — | — | — | — |
| WLn | Vr | Vpgm | -10V |
| — | — | — | — |
| WL0 | Vpass_read | Vpass_prgm | -10V |
| SSL4 | 0V | 0V or -2V | 0V or -2V |
| SL3 | 0V | Vcc | Vera(8V) |

MB3 (SEL_ST3) Selected Block (string)

|  | Read | Program | Erase |
|---|---|---|---|
| BL2k_0 | 1V | Vcc -> 0V/Vcc | Floating |
| DSL3_0 | 4V | 5V -> 1.5V | 0V |
| WLn+1 | Vpass_read | Vpass_prgm | -10V |
| — | — | — | — |
| WLn | Vr | Vpgm | -10V |
| — | — | — | — |
| WL0 | Vpass_read | Vpass_prgm | -10V |
| SSL3 | 4V | 0V or -2V | 0V or -2V |
| SL2 | 0V | Vcc | Vera(8V) |

MB3 (UNSEL_ST3) Selected Block (string), Common BL, Common SL, Common WLs

|  | Read | Program | Erase |
|---|---|---|---|
| BL2k | 1V | Vcc -> 0V/Vcc | Floating |
| DSL3_j | 0V | 5V > 0V or 2V | 0V |
| WLn+1 | Vpass_read | Vpass_prgm | -10V |
| — | — | — | — |
| WLn | Vr | Vpgm | -10V |
| — | — | — | — |
| WL0 | Vpass_read | Vpass_prgm | -10V |
| SSL3 | 4V | 0V or -2V | 0V or -2V |
| SL2 | 0V | Vcc | Vera(8V) |

MB2 (ST2) Un-Selected Block (string), Common SL, common WLs

|  | Read | Program | Erase |
|---|---|---|---|
| BL1k | Vcc | Vcc | Floating |
| DSL2 | 4V | 5V -> 0V or -2V | 0V |
| WLn+1 | Vpass_read | Vpass_prgm | -10V |
| — | — | — | — |
| WLn | Vr | Vpgm | -10V |
| — | — | — | — |
| WL0 | Vpass_read | Vpass_prgm | -10V |
| SSL2 | 0V | 0V or -2V | 0V or -2V |
| SL2 | 0V | Vcc | Vera(8V) |

MB1 (ST1) Un-Selected Block (string), Common BL, Common WLs

|  | Read | Program | Erase |
|---|---|---|---|
| BL1k | 0V | Vcc | Floating |
| DSL1 | 4V | 5V -> 0V or -2V | 0V |
| WLn+1 | Vpass_read | Vpass_prgm | -10V |
| — | — | — | — |
| WLn | Vr | Vpgm | -10V |
| — | — | — | — |
| WL0 | Vpass_read | Vpass_prgm | -10V |
| SSL1 | 0V | 0V or -2V | 0V or -2V |
| SL1 | 0V | Vcc | Vera(8V) |

MB4-1 (ST4) Un-Selected Block (string), Common BL

|  | Read | Program | Erase |
|---|---|---|---|
| BL2k | 1V | 0V/Vcc | Floating |
| DSL4 | 0V | 0V or -2V | 0V |
| WLn+1 | 0V | 0V | 0V |
| WLn | 0V | 0V | 0V |
| WL0 | 0V | 0V | 0V |
| SSL4 | 0V | 0V | 0V |
| SL3 | 0V | 0V | 0V |

MB3-1 (ST3) Un-Selected Block (string), Common BL

|  | Read | Program | Erase |
|---|---|---|---|
| BL2k | 1V | 0V/Vcc | Floating |
| DSL3 | 0V | 0V or -2V | 0V |
| WLn+1 | 0V | 0V | 0V |
| WLn | 0V | 0V | 0V |
| WL0 | 0V | 0V | 0V |
| SSL3 | 0V | 0V | 0V |
| SL2 | 0V | 0V | 0V |

MB2-1 (ST2) Un-Selected Block (string)

|  | Read | Program | Erase |
|---|---|---|---|
| BL1k | 0V | 0V | Floating |
| DSL2 | 0V | 0V or -2V | 0V |
| WLn+1 | 0V | 0V | 0V |
| WLn | 0V | 0V | 0V |
| WL0 | 0V | 0V | 0V |
| SSL2 | 0V | 0V | 0V |
| SL2 | 0V | 0V | 0V |

MB1-1 (ST1) Un-Selected Block (string)

|  | Read | Program | Erase |
|---|---|---|---|
| BL1k | 0V | 0V | Floating |
| DSL1 | 0V | 0V or -2V | 0V |
| WLn+1 | 0V | 0V | 0V |
| WLn | 0V | 0V | 0V |
| WL0 | 0V | 0V | 0V |
| SSL1 | 0V | 0V | 0V |
| SL1 | 0V | 0V | 0V |

In Table 3, the first column shows voltage conditions for a case in which the third memory block MB3 is selected from among the first to fourth memory blocks MB1 to MB4 that are sequentially stacked on top of one another, and more specifically, voltage conditions of the selected third vertical string ST3_0 of the third memory block MB3. The second column shows voltage conditions of the unselected vertical string ST3_i, among the third vertical strings ST3_0 to ST3_i of the selected third memory block MB3. In addition, the third column shows voltage conditions of the unselected 1-1 to 4-1 memory blocks MB1-1 to MB4-1.

First, a read operation is described below.

During a read operation of the selected third memory block MB3 including the selected vertical string ST3_0, the operation circuit may apply a precharge voltage (e.g., 1V) to the second bit line BL2k and apply a ground voltage (e.g., 0V) to the second source line SL2_0. The operation circuit may apply a voltage (e.g., 4V) to turn on a drain selection transistor to the third drain selection line DSL3_0 and apply a voltage (e.g., 4V) to turn on a source selection transistor to the third source selection line SSL3. When the operation circuit may apply the read voltage Vread to the selected word line SEL_WL and the read pass voltage Vpass_read to the unselected word lines, a voltage of the second bit line BL2k may be reduced or maintained in response to a threshold voltage of a memory cell coupled to the selected word line SEL_WL. The operation circuit may sense a variation in the voltage of the second bit line BL2k, latch data stored in the memory cell and output the latched data.

The operation circuit may apply a ground voltage (e.g., 0V) to the third drain selection line DSL3_i coupled to the unselected vertical string ST3_i in order to suppress a disturbance of the unselected vertical string ST3_i, among the third vertical strings ST3_0 to ST3_i included in the selected third memory block MB3.

The operation circuit may apply a ground voltage (e.g., 0V) to the second and fourth source selection lines SSL1 and SSL4 of the unselected first, second and fourth memory blocks MB1, MB2 and MB4. In addition, the operation circuit may apply a power voltage (e.g., Vcc) to the first bit lines BL10 to BL1k.

A program operation is described below.

During a program operation of the selected third memory block MB3, the operation circuit may apply a precharge voltage (e.g., 1V) to the second bit line BL2k, or apply the precharge voltage and subsequently discharge the voltage loaded in the second bit line BL2k in response to the data stored in the memory cell. The operating circuit may apply a power voltage (e.g., Vcc) to source lines SLm. Further, the operating circuit may apply a high voltage (e.g., 5V) to the third drain selection line DSL3_0 when the second bit line BL2k is precharged and subsequently apply a voltage having a normal level (e.g., 1.5V) when the precharging of the second bit line BL2k is completed. The operating circuit may apply a ground voltage (e.g., 0V) or a negative voltage (e.g., −2V) to the third source selection line SSL3. In addition, when the operation circuit applies the program voltage Vpgm to the selected word line SEL_WL and the program pass voltage Vpass_pgm to the unselected word lines, the threshold voltage of the memory cell coupled to the selected word line SEL_WL may be increased or maintained according to whether the second bit line BL2k is in a discharge state or a precharge state. Subsequently, the operation circuit may perform a program verify operation to detect whether or not the threshold voltage of the memory cell has increased to a target level.

An erase operation is described below.

During an erase operation of the selected third memory block MB3, the operation circuit may set the second bit lines BL20 to BL2k in a floating state and apply a positive voltage (e.g., 8V) corresponding to the erase voltage Verase to the source line SL2_0 to SL2_m. In addition, the operation circuit may apply a ground voltage (e.g., 0V) to the third drain selection line DSL3_0 to DSL3_i and apply a positive voltage (e.g., 8V) corresponding to the erase voltage to the third source selection line SSL3. In addition, when the operation circuit applies a negative voltage (e.g., −10V) to the word lines WL0 to WLn+1 of the selected third memory block MB3, threshold voltages of memory cells may be reduced. Subsequently, the operation circuit may perform an erase verify operation to detect whether or not the threshold voltages of the memory cells have decreased to a target level.

In addition, the operation circuit may apply a ground voltage (e.g., 0V) or a negative voltage (e.g., −2V) to the first, second and fourth source selection lines SSL1_0 to SSL1_i, SSL2_0 to SSL2_i and SSL4_0 to SSL4_i to the unselected first, second and fourth memory blocks MB1, MB2 and MB4.

Meanwhile, during the read operation, the program operation and the erase operation, a ground voltage (e.g., 0V) may be applied to the word lines WL0 to WLn of the unselected 1-1 to 4-1 memory blocks MB1-1 to MB4-1.

Figure 9:
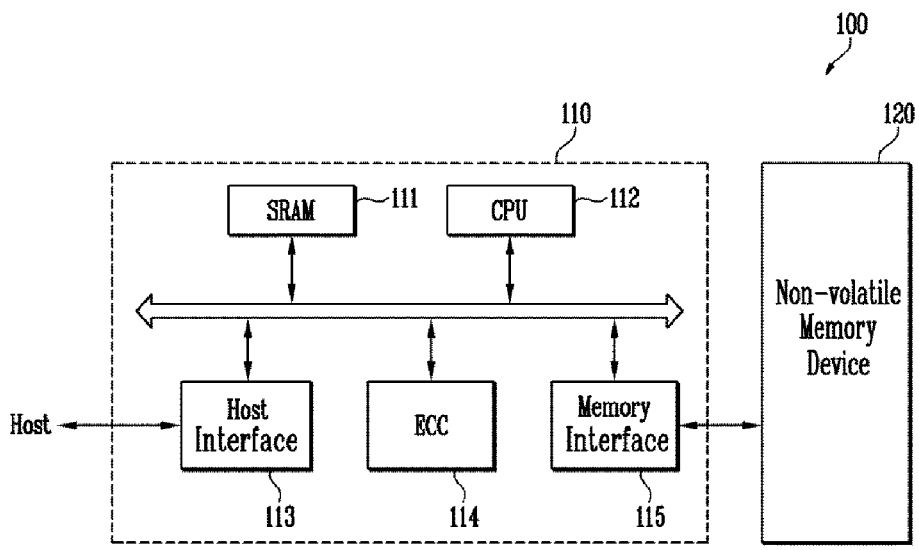
FIG. 9 is a block diagram illustrating the configuration of a memory system according to an embodiment of the present invention.

As illustrated in FIG. 9, a memory system 100 according to another of the present invention may include a non-volatile memory device 120 and a memory controller 110.

The non-volatile memory device 120 may have the above-described structure. In addition, the non-volatile memory device 120 may be a multi-chip package composed of a plurality of flash memory chips.

The memory controller 110 may be configured to control the non-volatile memory device 120. The memory controller 110 may include an SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 10:
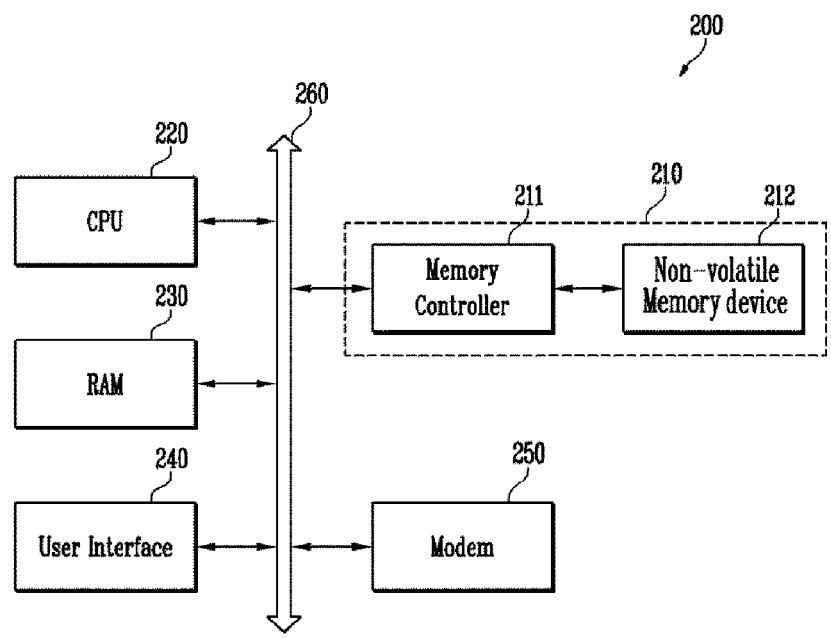
FIG. 10 is a block diagram illustrating the configuration of a computing system according to an embodiment of the present invention.

As illustrated in FIG. 10, a computing system 200 may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS) and mobile DRAM.

As described above in connection with FIG. 9, the memory system 210 may include a non-volatile memory device 212 and a memory controller 211.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a first memory block including a plurality of first vertical strings, wherein the first vertical strings include a plurality of first control gates which are stacked in order, respectively;
a second memory block including a plurality of second vertical strings electrically coupled in series with the plurality of first vertical strings, respectively, wherein the second memory block is stacked on the first memory block, and the second vertical strings include a plurality of second control gates which are stacked in order, respectively;
first bit lines located between the first memory block and the second memory block and electrically coupled to the first and second vertical strings;
a plurality of first source lines located under the first memory block and electrically coupled to the plurality of first vertical strings, respectively;
a plurality of second source lines located above the second memory block and electrically coupled to the second vertical strings, respectively;
a bit line voltage supply circuit;
a read/write circuit; and
a switch configured to couple the first bit lines to the bit line voltage supply circuit or the read/write circuit,
wherein the first control gates and the second control gates of the same position in the respective strings are electrically coupled in common.

2. The semiconductor device of claim 1, wherein the first source lines and the second source lines extend in parallel along a first direction, respectively, and the first bit lines extend in parallel along a second direction crossing the first direction.

3. The semiconductor device of claim 1, wherein the first bit lines, the first source lines and the second source lines extend in parallel along a first direction.

4. The semiconductor device of claim 1, wherein source selection lines of the first and second memory blocks are controlled in common, and the first and second source lines are independently controlled.

5. The semiconductor device of claim 1, wherein source selection lines of the first and second memory blocks are separately controlled, and the first and second source lines are separately controlled.

6. The semiconductor device of claim 1, wherein source selection lines of the first and second memory blocks are separately controlled, and the first and second source lines are controlled in common.

7. The semiconductor device of claim 1, further comprising:
a third memory block including a plurality of third vertical strings electrically coupled in series with the plurality of second vertical strings, respectively, wherein the third memory block is stacked on the second memory block, and the third vertical strings include a plurality of third control gates which are stacked in order, respectively;
a fourth memory block including a plurality of fourth vertical strings electrically coupled in series with the plurality of third vertical strings, wherein the fourth memory block is stacked on the third memory block, and the fourth vertical strings include a plurality of fourth control gates which are stacked in order, respectively;
a plurality of second bit lines located between the third memory block and the fourth memory block and electrically coupled to the plurality of third and the plurality of fourth vertical strings; and
a plurality of third source lines located above the fourth memory block and electrically coupled to the plurality of fourth vertical strings.

8. The semiconductor device of claim 7, wherein the first to third source lines extend in parallel along a first direction, and the first and second bit lines extend in parallel along the second direction crossing the first direction.

9. The semiconductor device of claim 7, wherein the first and second bit lines and the first to third source lines extend in parallel along the first direction.

10. The semiconductor device of claim 7, wherein the first to fourth control gates of the same position in the respective strings are electrically coupled in common, and the first to fourth memory blocks share an operating voltage supply circuit.

11. The semiconductor device of claim 7, wherein source selection lines of the first to fourth memory blocks are controlled in common, and the first to third source lines are separately controlled.

12. The semiconductor device of claim 11, further comprising:
an operating circuit configured to apply a precharge voltage to bit lines coupled to a selected memory block, to apply a ground voltage to source lines coupled to the selected memory block, to apply a power voltage to other source lines, to apply a turn-on voltage to the source selection lines of the first to fourth memory blocks, to apply a turn-on voltage to a drain selection line electrically coupled to a selected vertical string, among vertical strings included in the selected memory block, and to apply a read voltage to a selected word line, during a read operation.

13. The semiconductor device of claim 12, wherein the operating circuit is configured to apply the ground voltage to drain selection lines electrically coupled to unselected vertical strings of the selected memory block, drain selection lines of unselected memory blocks and bit lines electrically coupled to the unselected memory blocks, respectively during a read operation.

14. The semiconductor device of claim 11, further comprising:
an operating circuit configured to apply a precharge voltage to bit lines electrically coupled to a selected memory block, to apply a high voltage to a drain selection line electrically coupled to a selected vertical string among vertical strings included in the selected memory block, to apply a normal voltage the drain selection line when precharging of the bit lines is completed, to apply a ground voltage or a negative voltage is applied to source selection lines of the selected memory block, and to apply a program voltage to a selected word line, during a program operation.

15. The semiconductor device of claim 11, further comprising:
an operating circuit configured to make a floating of bit lines a selected memory block, to apply an erase voltage to source lines electrically coupled to a selected memory block, to apply a ground voltage to other source lines, to apply the ground voltage a drain selection line coupled to a selected vertical string among vertical strings of the selected memory block, to apply the erase voltage is applied to a source selection line electrically coupled to the selected vertical string, and to apply a negative voltage to selected word lines, during an erase operation.

16. The semiconductor device of claim 11, wherein the operating circuit is apply the erase voltage to source select lines of unselected memory blocks, during an erase operation.

17. The semiconductor device of claim 7, wherein the source selection lines of the first to fourth memory blocks are separately controlled, and the first to third source lines are separately controlled.

18. The semiconductor device of claim 17, further comprising: an operating circuit configured to apply a precharge voltage to bit lines electrically coupled to a selected memory block, to apply a ground voltage to source lines electrically coupled to the selected memory block, to apply a turn-on voltage to drain selections line of the selected memory block, to apply the turn-on voltage to a source selection line of the selected memory block, to apply a read voltage to a selected word line, to apply a power voltage to bit lines coupled to unselected memory blocks, to apply the power voltage or the ground voltage to source lines coupled to the unselected memory blocks, to apply the turn-on voltage or the ground voltage to drain selection lines of the unselected memory blocks, and to apply the ground voltage or the power voltage to source selection lines of the unselected memory blocks, during a read operation.

19. The semiconductor device of claim 7, wherein the source selection lines of the first to fourth memory blocks are separately controlled, and the first to third source lines are equally controlled.

20. The semiconductor device of claim 19, further comprising: an operating circuit is configured to apply a precharge voltage to bit lines electrically coupled to a selected memory block, to apply a ground voltage to the first to third source lines, to apply a turn-on voltage to a drain selection line electrically coupled to a selected vertical string among vertical strings included in the selected memory block, to apply a turn-on voltage to a source selection line coupled to the selected vertical string and to apply a read voltage is applied to a selected word line, during a read operation.

* * * * *